(12) United States Patent
Colinge et al.

(10) Patent No.: US 11,133,404 B2
(45) Date of Patent: Sep. 28, 2021

(54) FINFET DEVICE INCLUDING A STEM REGION OF A FIN ELEMENT

(71) Applicant: Taiwan Semiconductor Manufacturing Company, Ltd., Hsinchu (TW)

(72) Inventors: Jean-Pierre Colinge, Hsinchu (TW); Kuo-Cheng Ching, Hsinchu (TW); Zhiqiang Wu, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 8 days.

(21) Appl. No.: 16/665,289

(22) Filed: Oct. 28, 2019

(65) Prior Publication Data

US 2020/0058770 A1     Feb. 20, 2020

Related U.S. Application Data

(60) Continuation of application No. 15/676,027, filed on Aug. 14, 2017, now Pat. No. 10,461,176, which is a division of application No. 13/745,431, filed on Jan. 18, 2013, now Pat. No. 9,735,255.

(51) Int. Cl.
*H01L 29/66* (2006.01)
*H01L 29/78* (2006.01)
*H01L 29/10* (2006.01)
*H01L 21/8234* (2006.01)

(52) U.S. Cl.
CPC .......... *H01L 29/66795* (2013.01); *H01L 21/823431* (2013.01); *H01L 29/1054* (2013.01); *H01L 29/66545* (2013.01); *H01L 29/785* (2013.01); *H01L 29/7853* (2013.01)

(58) Field of Classification Search
CPC ......... H01L 29/66795; H01L 29/66818; H01L 29/785; H01L 29/7853; H01L 29/1054; H01L 21/823841; H01L 21/82343; H01L 21/823431
See application file for complete search history.

(56) References Cited

U.S. PATENT DOCUMENTS

| | | | |
|---|---|---|---|
| 6,359,311 B1 | 3/2002 | Colinge et al. |
| 6,946,377 B2 | 9/2005 | Chambers et al. |
| 7,811,875 B2 | 10/2010 | Anderson |
| 7,863,674 B2 | 1/2011 | Yeo et al. |

(Continued)

FOREIGN PATENT DOCUMENTS

TW     201017772     5/2010

OTHER PUBLICATIONS

Taiwanese Office Action dated May 22, 2015, 6pgs.

(Continued)

*Primary Examiner* — Fernando L Toledo
*Assistant Examiner* — Aaron J Gray
(74) *Attorney, Agent, or Firm* — Haynes and Boone, LLP

(57) ABSTRACT

A finFET device having a substrate and a fin disposed on the substrate. The fin includes a passive region, a stem region overlying the passive region, and an active region overlying the stem region. The stem region has a first width and the active region has a second width. The first width is less than the second width. The stem region and the active region also have different compositions. A gate structure is disposed on the active region.

20 Claims, 20 Drawing Sheets

(56) References Cited

U.S. PATENT DOCUMENTS

| | | | |
|---|---|---|---|
| 8,106,464 | B2 | 1/2012 | Cho et al. |
| 8,114,746 | B2 | 2/2012 | Wei et al. |
| 8,492,235 | B2 | 7/2013 | Toh et al. |
| 8,697,523 | B2 | 4/2014 | Cai et al. |
| 8,809,131 | B2 | 8/2014 | Bangsaruntip et al. |
| 8,901,607 | B2 | 12/2014 | Wang et al. |
| 2007/0045748 | A1* | 3/2007 | Booth, Jr. ....... H01L 21/823807 257/369 |
| 2009/0008705 | A1* | 1/2009 | Zhu ................... H01L 29/66795 257/327 |
| 2010/0059807 | A1 | 3/2010 | Cho et al. |
| 2010/0144121 | A1* | 6/2010 | Chang ................. H01L 29/7851 438/478 |
| 2012/0171832 | A1* | 7/2012 | Toh ..................... H01L 29/0847 438/300 |
| 2013/0200468 | A1 | 8/2013 | Cai et al. |
| 2014/0021538 | A1 | 1/2014 | Bangsaruntip et al. |
| 2018/0019325 | A1 | 1/2018 | Colinge et al. |

OTHER PUBLICATIONS

Fu-Liang Yang, Hao-Yu Chen, Fang-Cheng Chen, Cheng-Chuan Haung, Chang-Yun Chang, Hsien-Kuang Chiu, Ch-Chuang Lee, Chi-Chun Chen, Huan-Tsung Huang, Chih-Jian Chen, Hun-Jan Tao, Yee-Chia Yeo, Mong-Song Liang and Chenming Hu; "25 nm CMOS Omega FETs;" 2002; IEDM 255-IEDM 258; 10.3.1; Taiwan Semiconductor Manufacturing Company; IEEE; Taiwan.

T. Park, S. Choi, D.H. Lee, J.R. Yoo, B.C. Lee, J.Y. Kim, C.G. Lee, K.K.Chi, S.H. Hong, S.J. Hyun, Y.G. Shin, J.N. Han, I.S. Park, U.I. Chung, J.T. Moon, E. Yoon and J.H. Lee; "Fabrication of Body-Tied FinFETs (Omega MOSFETs) Using Bulk Si Wafers;" 2003; pp. 135-136; 10A-3; Symposium on VLSI Technology Digest of Technical Papers.

Jean-Pierre Colinge; "Multiple-Gate SOI MOSFETs;" 2004; pp. 897-905; Solid-State Electronics 48; Elsevier Ltd.

Thomas Skotnicki and Frederic Boeuf; "How Can High Mobility Channel Materials Boost or Degrade Performance in Advanced CMOS;" 2010; pp. 153-154; Symposium on VSLI Technology Digest of Technical Papers; IEEE.

\* cited by examiner

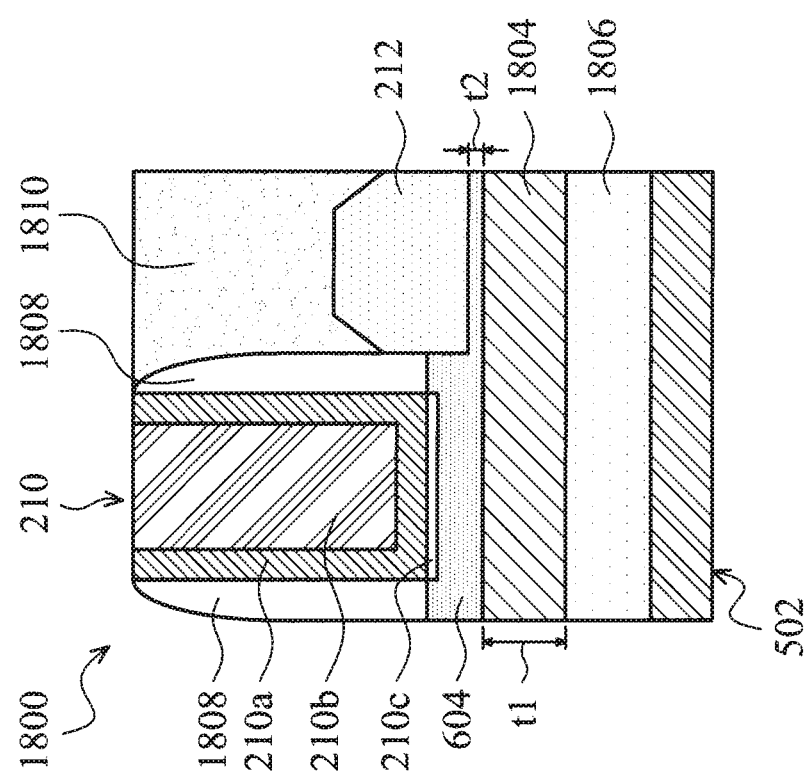
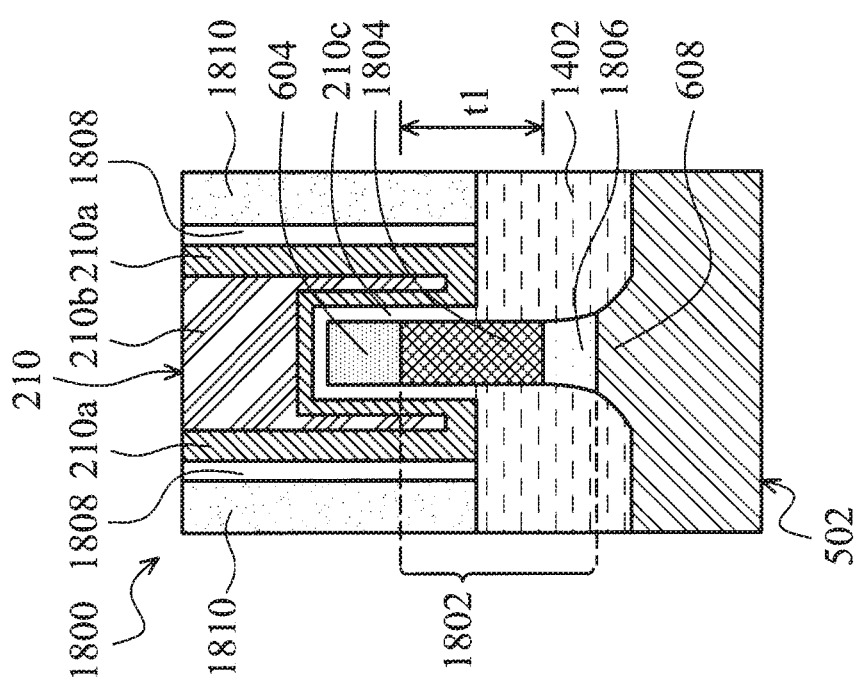
Fig. 18a
Fig. 18b

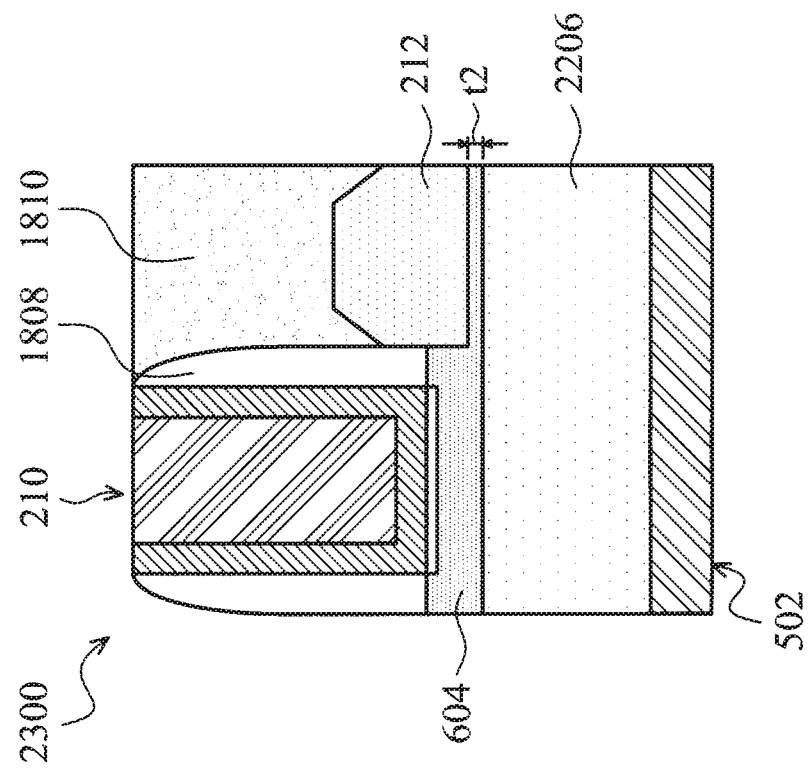
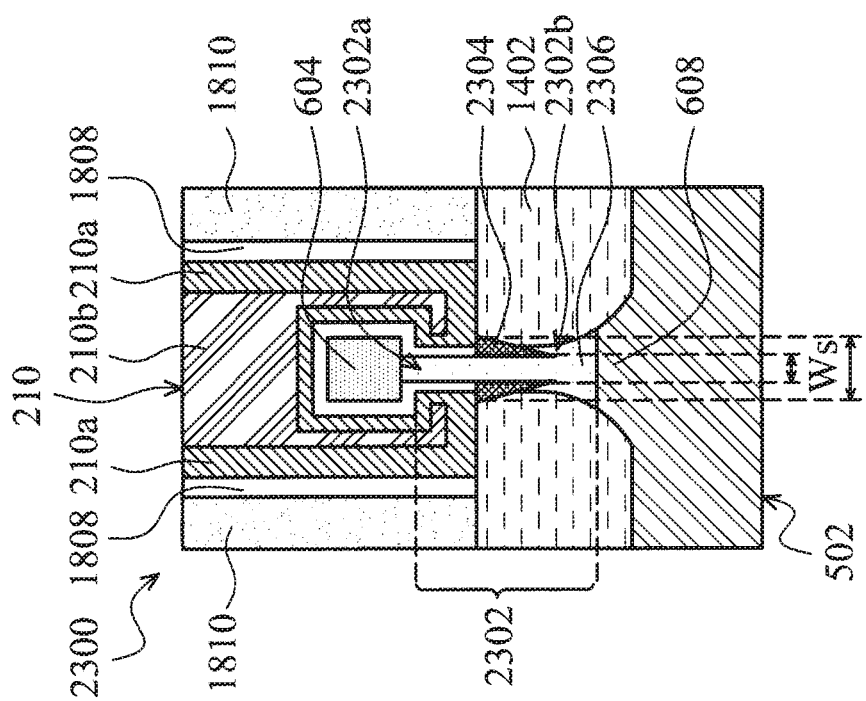
Fig. 23a
Fig. 23b

FINFET DEVICE INCLUDING A STEM REGION OF A FIN ELEMENT

CROSS-REFERENCE TO RELATED APPLICATION

The present application is a continuation application of U.S. patent application Ser. No. 15/676,027, filed Aug. 14, 2017, which is a divisional application of U.S. patent application Ser. No. 13/745,431, filed Jan. 18, 2013, now U.S. Pat. No. 9,735,255, each of which is hereby incorporated by reference in its entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (finFET) device. A typical finFET device is fabricated with a thin "fin" (or fin-like structure) extending from a substrate. The fin usually includes silicon and forms the body of the transistor device. The channel of the transistor is formed in this vertically-extending fin. A gate is provided over (e.g., wrapping) the fin. This type of gate allows greater control of the channel. However, there has been a desire to have even greater control over the gate. Methods of performing such control include using gate-all-around and/or omega or quasi-surround architecture. However, fabrication of GAA structures faces substantial challenges. Similarly, quasi-surround architecture has processing challenges includes those introduced by their formation on a silicon-on-insulator (SOI) substrates.

Therefore, while existing methods of fabricating gate structures having improved control are adequate for some purposes, additional improvements may be desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 18a, 18b, 19a, 19b, 20a, 20b, 21a, 21b, 22a, 22b, and 23a, 23b illustrate cross-sectional views of embodiments of finFET devices fabricated according to one or more steps of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
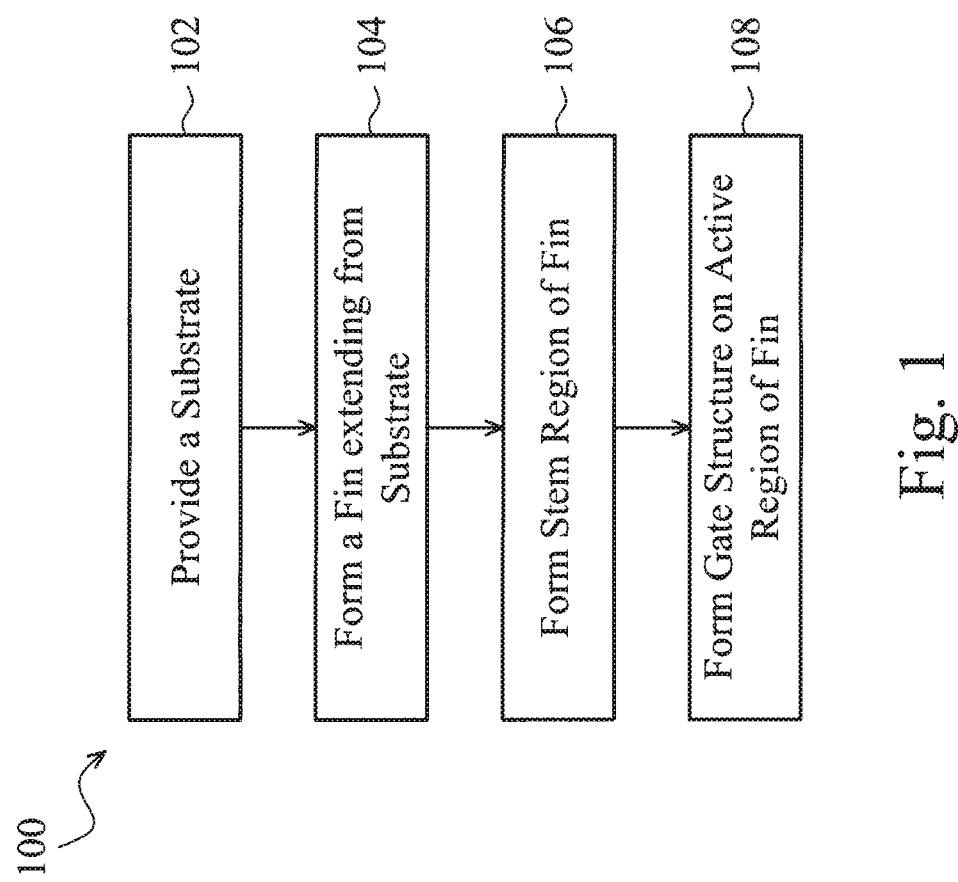
FIG. 1 is a flow chart of an embodiment of a method of fabricating a finFET device according to one or more aspects of the present disclosure.

FIG. 1 is a flowchart of a method 100 for fabricating a finFET device in accordance with various aspects of the present disclosure. It is understood that additional steps can be provided before, during, and after the method 100 and some of the steps described below can be replaced or eliminated, for additional embodiments of the method. As employed in the present disclosure, the term FinFET device refers to any fin-based, multi-gate transistor including nanowire transistors. The finFET devices described herein may be included in a microprocessor, memory cell, and/or other integrated circuit devices.

The method 100 begins with block 102 in which a semiconductor substrate is provided. The substrate may be a semiconductor substrate that includes an elementary semiconductor including silicon and/or germanium in crystal; a compound semiconductor including silicon carbide, gallium arsenide, III-V semiconductors such as gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate may include various regions that have been suitably doped (e.g., p-type or n-type conductivity). The semiconductor substrate may not be an SOI substrate, or in other words be a bulk semiconductor substrate. In other embodiments, the semiconductor substrate is an SOI substrate. The substrate may include a plurality of epitaxial layers, and be referred to, for example, as a multilayer substrate.

The method 100 then proceeds to block 104 where a fin element (or fin) is formed extending from the substrate. A plurality of fins may be formed so that isolation regions such as, for example, shallow trench isolation (STI) features, interpose the fins. The fins comprise any suitable material, for example, silicon (Si-fin). In an embodiment, the fins may include multiple layers such as one or more epitaxial layers grown on the bulk semiconductor substrate and/or the bulk semiconductor substrate itself. The fin may be formed by any suitable process including various deposition, photolithography, etching, epitaxy, and/or other suitable processes. An exemplary photolithography process may include forming a photoresist layer (resist) overlying the substrate (e.g., on a silicon layer or other epitaxial layer), exposing the resist to a pattern, performing a post-exposure bake process, and developing the resist to form a masking element including the resist. The masking element may then be used to etch the fin structure into the semiconductor material layer(s). The fins may be etched using reactive ion etching (RIE) processes and/or other suitable processes. Alternatively, the fins may be formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes. Again, each fin may include multiple layers (e.g., bulk semiconductor substrate and overlying epitaxial layer(s)). Alternatively, a fin may be grown epitaxially inside openings in the STI features. As an example, these openings or holes may be produced by etching silicon fins in a substrate, filling the space between fins with STI, and then etching the fins away to provide the openings.

The method 100 then proceeds to block 106 where a stem region is formed in the fin structure (also referred to as a fin) extending from the substrate. The stem region includes the region of the fin underlying an active region of the fin. The active region of the fin may provide the channel-region of the transistor device (i.e., FinFET) associated with the fin. The stem region may be decreased in width as compared to the active region, partially oxidized, completely oxidized, and/or other suitable means for decreasing the conductive region underlying the active region of the fin. (It is noted that the dimension of the fin corresponding to the gate length of the device is referred to herein as its width as seen in the cross-sectional views discussed below). Embodiments of the formation of the stem region are discussed in greater detail below.

The stem region may be formed in a portion of the fin having a given composition, for example, different than the composition of the active region of the fin. In an embodiment, the stem region includes a composition that is selectively etched and/or selectively oxidized in comparison with the composition of an active region of the fin. The stem region may include a first epitaxial layer and the active region may include a second epitaxial layer. A passive region of the fin may underlie the stem region. In an embodiment, the passive region may have a composition of the bulk semiconductor substrate.

In an embodiment, the stem region is formed (e.g., a modification of the originally formed fin) during a replacement-gate or gate-last methodology. In an embodiment, after the formation of the fin a dummy gate structure is formed thereon. Spacer elements and a surrounding interlayer dielectric (ILD) layer are formed around the dummy gate structure. The dummy gate structure is subsequently removed and a trench formed. The formation (e.g., etching and/or oxidation) of the stem region may be performed in the opening provided by the trench.

The method 100 then proceeds to block 108 where a gate structure is formed on an active region of the fin. The gate structure may be formed by a gate-last or replacement-gate methodology (e.g., formed in the trench discussed above). The gate structure may include a gate dielectric layer, a gate electrode layer, and/or other suitable layers such as capping layers, interface layers, work function layers, diffusion/barrier layers, etc. The gate structure and/or fin may be patterned such that the gate structure wraps around a portion of the fin structure. For example, the gate structure may contact at least three surfaces of the active region of the fin structure (e.g., the top and opposing side surfaces). In a further embodiment, the gate wraps around or quasi-around the fin structure such that the gate structure contacts a fourth surface of the active region of the fin structure (e.g., the bottom surface). Such a gate may be referred to herein as an omega-gate or quasi-surround gate structure.

The gate dielectric layer comprises a dielectric material, such as silicon oxide, silicon nitride, high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology. Source/drain features may be formed on extensions of the fin lying on either side of the active portion of the fin structure. The source/drain features may be forms using ion implantation, diffusion, laser annealing, epitaxial growth, and/or other suitable processes.

The method 100 may be implemented using any of the methods described below such as the method 400 and the method 1000 of FIGS. 4 and 10 respectively. Benefits of some embodiments of the method 100 or portions thereof may include, for example, improving the subthreshold slope (swing). Improving the subthreshold slope may increase the Ion/Ioff ratio in the associated transistor. This may allow for lowering of the supply voltage and/or power consumption. The method 100 or portions thereof may also provide for improving the drain-induced-barrier-lowering (DIBL) of the associated transistor which may also improve performance of the device.

Figure 2:
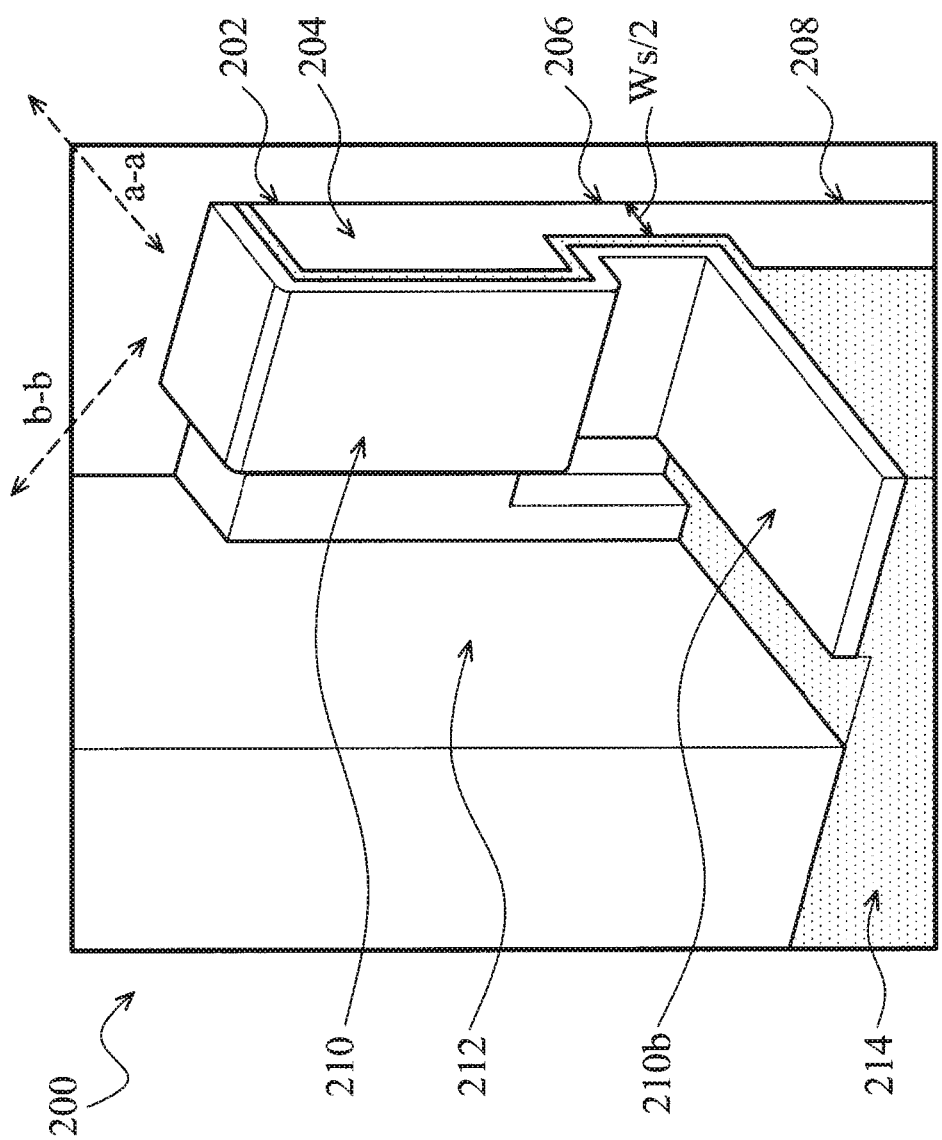
FIG. 2 is a perspective view of an embodiment of a finFET device according to one or more aspects of the present disclosure. It is noted that a portion of a finFET element is illustrated (e.g., a quarter of a gate structure), as discussed below.
Figure 3:
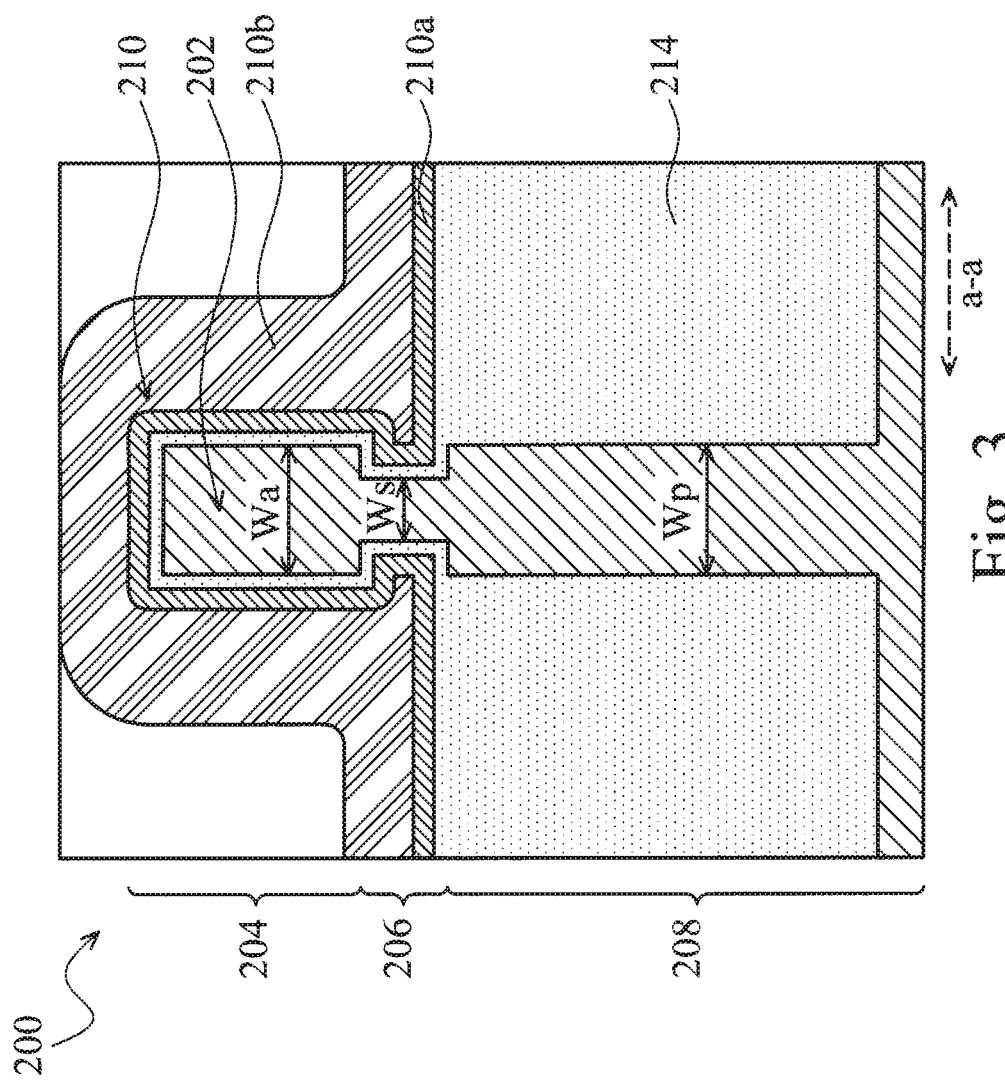
FIG. 3 is a cross-sectional view of an embodiment of a finFET device according to one or more aspects of the present disclosure.

FIGS. 2 and 3 illustrate an embodiment of a portion of a semiconductor device 200 having a fin 202. The semiconductor device 200 illustrates a finFET device (e.g., transistor) or any portion thereof (e.g., a fin). It is noted in FIG. 2 that a portion of the device 200 is illustrated. For example, a quarter or quadrant of a device 200 is illustrated (e.g., a portion to one side of a center-line down the fin 202, and one side of a center-line crossing the fin) is shown, while the mirror image is not. FIG. 4 illustrates a cross-section on a-a of the finFET device 200. It is further understood that additional features can be added in the semiconductor device 200 and some of the features described below can be replaced or eliminated, for additional embodiments of the semiconductor device 200.

The fin 202 includes an active region 204, a stem region 206, and a passive region 208. The channel of the semiconductor device 200 may be provided in the active region 204. As illustrated the stem region 206 may include a width Ws less than that of the width Wa of the active region 204 and/or the width Wp of the passive region 208. The Wp may be substantially equal to the width Wa. The width Ws may be between approximately 1% and approximately 99% of the width Wa and/or the width Wp. In an embodiment, the width Ws is between approximately 40% and approximately 60% of the width Wa and/or the width Wp. As a further example, in an embodiment, the width of the fin (Wa and/or Wp) may be approximately 10 nanometers and the width of the stem region (Ws) may be approximately 5 nanometers. As a further example, in an embodiment, the width of the fin (Wa and/or Wp) may be approximately 6 nanometers and the width of the stem region (Ws) may be approximately 3 nanometers. In an embodiment, the reduction of Ws by approximately 50% provides a reduction of Ioff by a factor of 10.

A gate structure 210 (or portion thereof) is illustrated on and around the fin 202. The gate structure 210 may include a gate dielectric layer 210a and a gate electrode 210b; however, numerous other layers may be present. Source/drain region 212 is provided adjacent the gate structure 210. In an embodiment the source/drain region 212 is an epitaxially-grown semiconductor material. An isolation feature 214 such as a shallow trench isolation (STI) feature is formed adjacent the fin.

It is noted that in an embodiment, the device 200 is not formed on a silicon-on-insulator (SOI) substrate. For example, the device 200 may be provided on a bulk (e.g., semiconductor) substrate. In other embodiments, the device 200 is formed on an SOI substrate.

It is noted that the stem region 204 of FIGS. 2 and 3 are exemplary only and not intended to be limiting. For example, other embodiments according to aspects of the present disclosure are discussed below and include a stem region including an oxidized form of the fin material having a decreased width or a substantially similar width as that of the active and/or passive portions of the device.

As discussed above, the device 200 may illustrate improvement in performance in comparison with a conventional finFET device having a consistent width of fin and/or no stem region. For example, in an embodiment, providing a stem region reduces Ioff including as discussed above. As another example, in an embodiment, providing a stem region improves saturation subthreshold slope (SSat). As yet another example, in an embodiment, providing a stem region improves DIBL.

Figure 4:
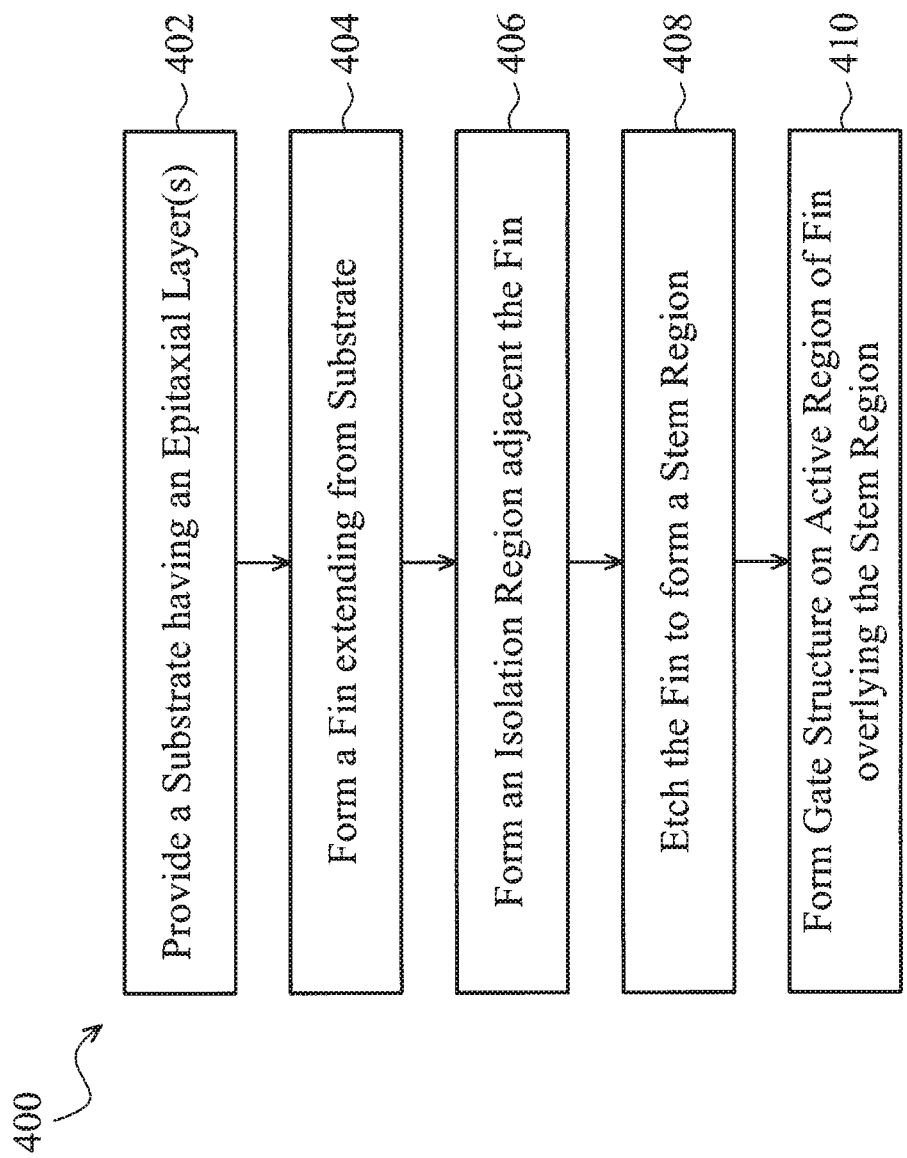
FIG. 4 is a flow chart of an embodiment of a method of fabricating a finFET device having an etched stem region according to one or more aspects of the present disclosure.

Referring now to FIG. 4, illustrated is a method 400 of fabricating a finFET device. The method 400 may be an embodiment of the method 100 and may be substantially similar to as discussed above with reference to the method 100 and/or the device 200, referred to with respect to FIGS. 1, 2, and 3. FIGS. 5, 6, 7, 8, and 9 are cross-sectional views of an exemplary embodiment of a finFET device (similarly taken along the plane a-a) corresponding to one or more steps of the method 400.

The method 400 begins at block 402 where a substrate having an epitaxial layer(s) is provided. The substrate may be substantially similar to as discussed above with reference to FIGS. 1, 2, and/or 3. The substrate may include a plurality of layers such as, for example, a bulk layer having one or more epitaxial layers formed thereon. In an embodiment, a bulk layer and an epitaxial layer have a different composition. For example, in an embodiment, the substrate includes a silicon bulk substrate having a SiGe layer (e.g., epitaxially grown or otherwise deposited) disposed thereon. Another semiconductor layer such as a silicon layer (e.g., epitaxially grown or otherwise deposited) may be provided on the SiGe layer. However, the present disclosure is not limited to a silicon/silicon germanium combination. For example, any combination of semiconductor materials may be provided in the multilayer substrate. In an embodiment, the semiconductor materials include III-V materials. Exemplary semiconductor materials include Ge, SiGe, SiGeC, SiC, Si, and/or other suitable materials. As illustrated below, a criteria for the selection of the semiconductor materials may include a difference in the oxidation and/or etching rate of the materials used (e.g., a difference in etching/oxidation rate of the active region of the fin and/or the passive region of the fin with the etching/oxidation rate of the stem region of the fin).

Figure 5:
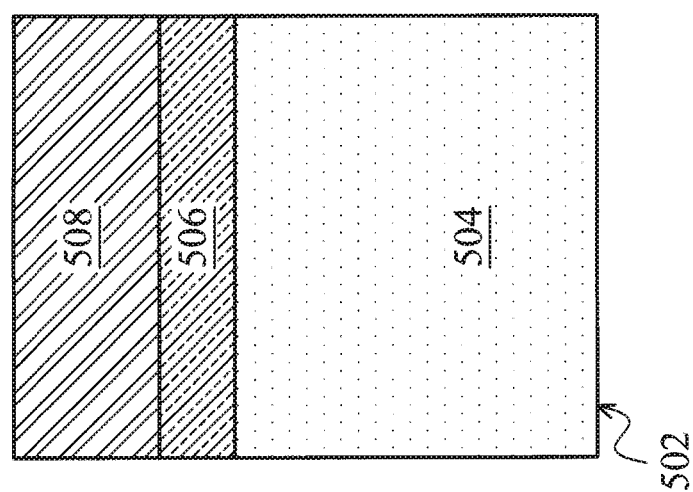

Referring to the example of FIG. 5, a substrate 502 is provided. The substrate 502 is a multilayer substrate. The substrate 502 includes a bulk layer 504, a first layer 506, and a second layer 508. One or more of the first layer 506 and/or the second layer 508 may be formed by an epitaxial growth process. The first layer 506 may be referred to as a stem-region forming layer. The first layer 506 may have a different composition than the bulk layer 504 and/or the second layer 508. The oxidation and/or etching rate of the first layer 504 may be different than the oxidation and/or etching rate of the second layer 508 and/or the bulk layer 504. In an embodiment, the first layer 506 includes a composition with an increased etch rate and/or oxidation rate than the composition of the bulk layer 504 and/or the second layer 508. In an embodiment, the bulk layer 504 and the second layer 508 include a substantially similar composition. In one embodiment, the bulk layer 504 is silicon, the second layer 508 is silicon, and the first layer 506 is SiGe. In a further embodiment, the bulk layer 504 and/or the second layer 508 are suitably doped (e.g., P—Si).

The method 400 then proceeds to block 404 where one or more fins are formed on the substrate. The fins may be formed substantially similar to as discussed above with reference to FIGS. 1, 2, and/or 3. The fins may each be a multilayer fin (e.g., including a plurality of layers and/or compositions). Referring to the example of FIG. 6, a fin 602 is formed in the substrate 502. The fin 602 includes the bulk layer 504, the first layer 506 and the second layer 508. The fin 602 also includes a defined active region 604, stem-forming region 606 and passive region 608. These regions are discussed in greater detail in the following steps.

The method 400 then proceeds to block 406 where an isolation region is formed adjacent to and/or interposing fin structures. The isolation region may be substantially similar to as discussed above with reference to FIGS. 1, 2, and/or 3. The isolation region may include a STI feature. In an embodiment, the isolation region includes a dielectric material such as silicon dioxide. In an embodiment, block 406 may precede block 404. Referring to the example of FIG. 7, STI structures 214 are disposed on the substrate 502 adjacent the fin 602. In an embodiment, the STI structure 214 has a top surface substantially co-planar with a surface of the stem region 606. In an embodiment, the STI feature 214 has a top surface that is not co-planar (e.g., lies above or below) a surface of the stem region 606.

The method 400 then proceeds to block 408 where a stem region is formed in the fin. In an embodiment, the stem region is formed by etching a stem-forming region of the fin. In an embodiment, the stem-forming region may be etched using a reactive ion etch (REI), wet etch, dry etch, and/or other suitable etching process. The etching may provide a reduction in the width of the fin at the stem region. (The width of the fin may correspond to the dimension of the active region of the fin defining the gate length.) The etching may provide a stem region of the fin may having a width less than that of the width of the active region and/or the width of the underlying passive region. Referring to the example of FIG. 8, the stem region 606 of the fin has been etched (i.e., the first layer 506 etched) such that its width Ws is decreased. In an embodiment, the width Ws may be between approximately 1% and approximately 99% of the width Wa and/or the width Wp. In an embodiment, the width Ws is between approximately 40% and approximately 60% of the width Wa and/or the width Wp.

The method 400 then proceeds to block 410 where a gate structure is formed on the active region of the fin. The active region of the fin overlies the stem region of the fin provided in block 408. The gate structure may be substantially similar to as discussed above with reference to FIGS. 1, 2, and 3. In an embodiment, the gate structure includes a gate dielectric and gate electrode layer. Referring to the example of FIG. 9, a gate structure 210 is disposed on the active region of the fin 604. The gate structure 210 includes a gate dielectric layer 210b and a gate electrode layer 210a.

In an embodiment, block 410 includes forming a metal gate structure as part of gate-last or replacement gate methodology. In an embodiment, a dummy gate (e.g., polysilicon) is formed on the fin prior to the formation of the stem region of the fin (e.g., the etching of block 408). A portion of this dummy gate structure is then removed while surrounding material—the spacer and dielectric (e.g., ILD)—remain and define a trench within which a replacement gate can be formed. The removal of the dummy gate (e.g., polysilicon) exposes the underlying fin structure. The exposed fin may then be etched to form the stem region as described above with reference to block 408. This provides for a self-aligned etch of the stem region of the fin.

Figure 10:
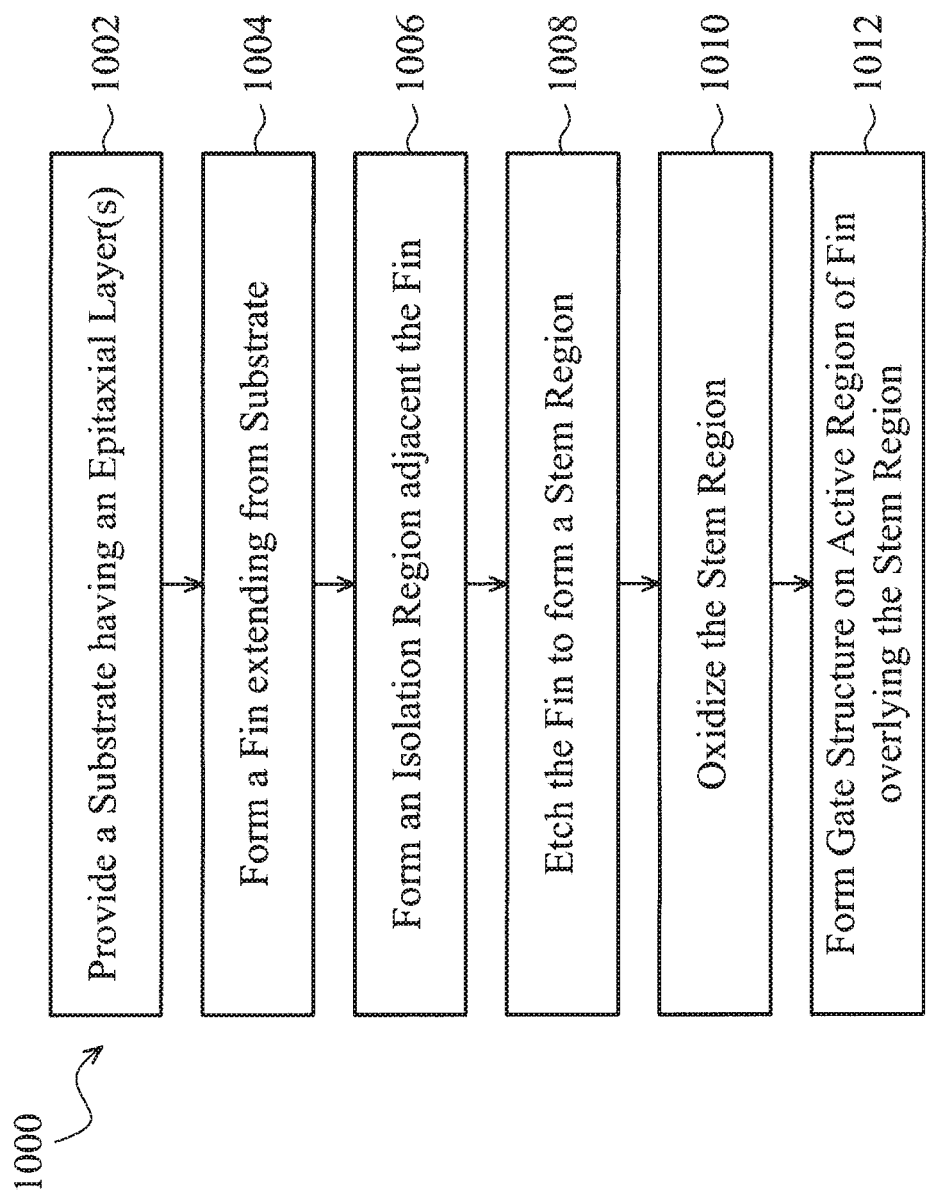
FIG. 10 is a flow chart of an embodiment of a method of fabricating a finFET device having an oxidized stem region according to one or more aspects of the present disclosure.

Referring now to FIG. 10, illustrated is a method 1000 of fabricating a finFET device. The method 1000 may be an embodiment of the method 100 and may be substantially similar to as discussed above with reference to the method 100 and/or the device 200, referred to with respect to FIGS. 1, 2, and 3. FIGS. 5, 6, 7, 8, 11, and 12 are cross-sectional views of an exemplary embodiment of a finFET device (similarly taken along the plane a-a as illustrated in FIG. 2) corresponding to one or more steps of the method 1000.

Figure 6:
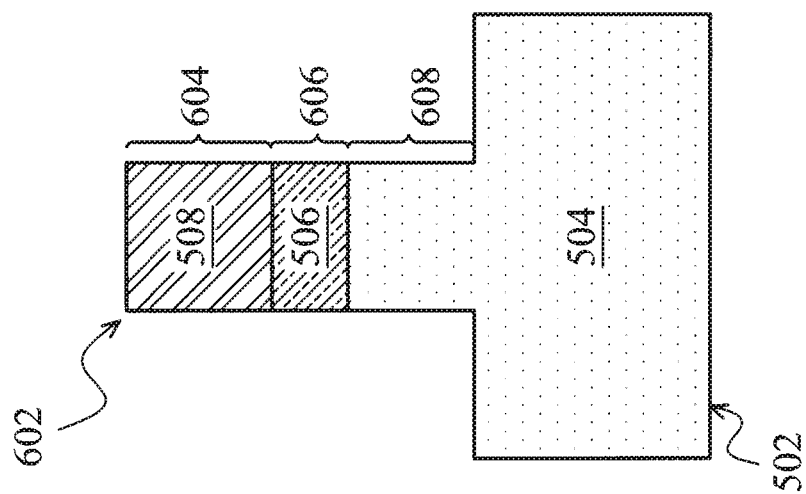
FIGS. 5-9 illustrate cross-sectional views of an embodiment of a finFET device fabricated according to one or more steps of the method of FIG. 4.
Figure 7:
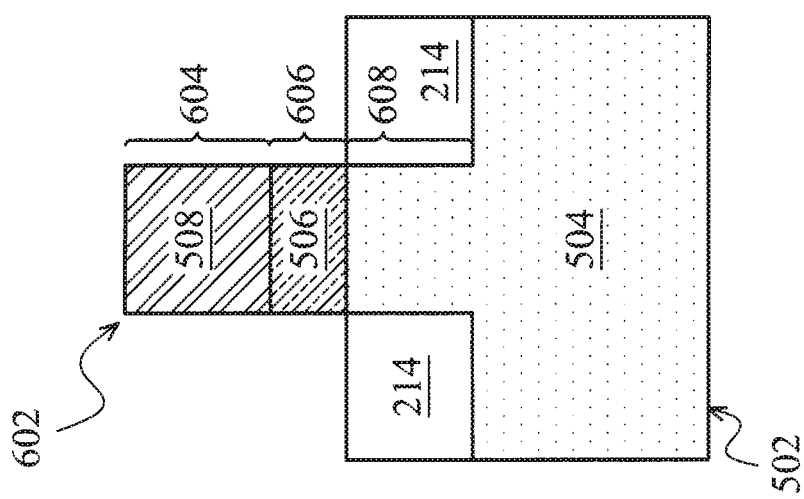
Figure 9:
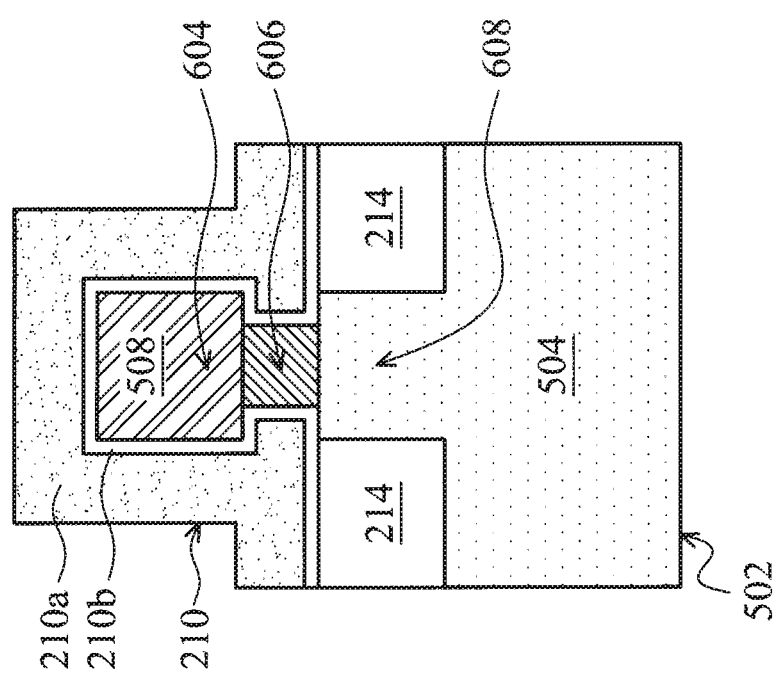

The method 1000 begins at block 1002 where a substrate having an epitaxial layer is provided. In an embodiment, a plurality (e.g., two) epitaxial layers are provided on a bulk semiconductor substrate. Block 1002 may be substantially similar to block 402, described above with reference to FIG. 4. FIG. 5 is illustrative of an exemplary embodiment and also described above. The method 1000 then proceeds to block 1004 where a fin or plurality of fins are formed extending from the substrate. The fin may include the epitaxial layer(s) and the bulk semiconductor material. Block 1004 may be substantially similar to block 404, described above with reference to FIG. 4. FIG. 6 is illustrative of an exemplary embodiment and also described above. The method 1000 then proceeds to block 1006 where an isolation region is formed adjacent to and/or interposing fin structures. Block 1006 may be substantially similar to block 406, described above with reference to FIG. 4. FIG. 7 is illustrative of an exemplary embodiment and also described above.

Figure 8:
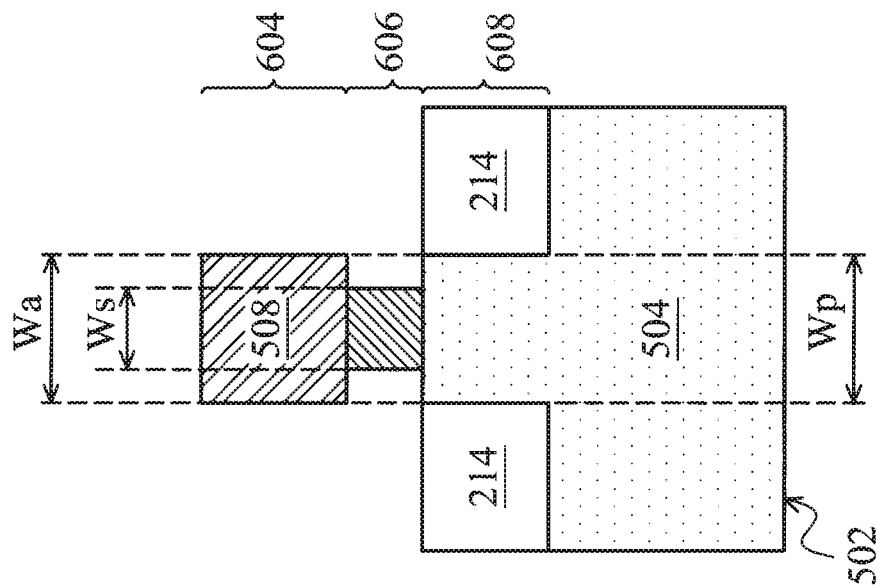

The method 1000 then proceeds to block 1008 where a stem region is formed in the fin. Block 1008 may be substantially similar to block 408, described above with reference to FIG. 4. FIG. 8 is illustrative of an exemplary embodiment and also described above. In an embodiment, the stem region is formed by decreasing a width of the stem-forming region of the fin, as described above and illustrated in FIG. 8.

The method 1000 then proceeds to block 1010 where the stem region is oxidized. In an embodiment, the stem region is oxidized after the stem etch process described above with reference to block 1008. In another embodiment, the stem region may be oxidized prior to or concurrently with the etching. In an embodiment, the stem region includes silicon germanium that oxidizes to form SiGeO. However, other compositions are possible including for example silicon dioxide, SiGeCO, SiCO, GeO, and/or other suitable oxides.

Figure 11:
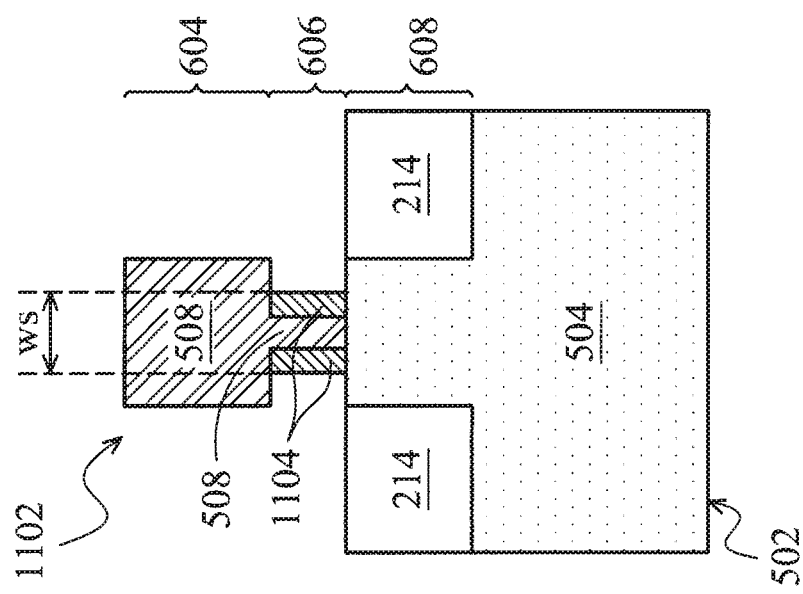

In an embodiment, the stem region is partially oxidized. FIG. 11 is illustrative of an embodiment of a fin 1102 having the stem region 606 partially oxidized to form oxidized region 1104. The oxidized region 1104 does not extend through the stem region 606. The stem region 606 may have a width ws, substantially similar to as discussed above. In an embodiment, the oxidized region 1104 is SiGeO. However, other compositions are possible including for example silicon dioxide, SiGeCO, SiCO, $GeO_2$, and/or other suitable oxides.

Figure 12:
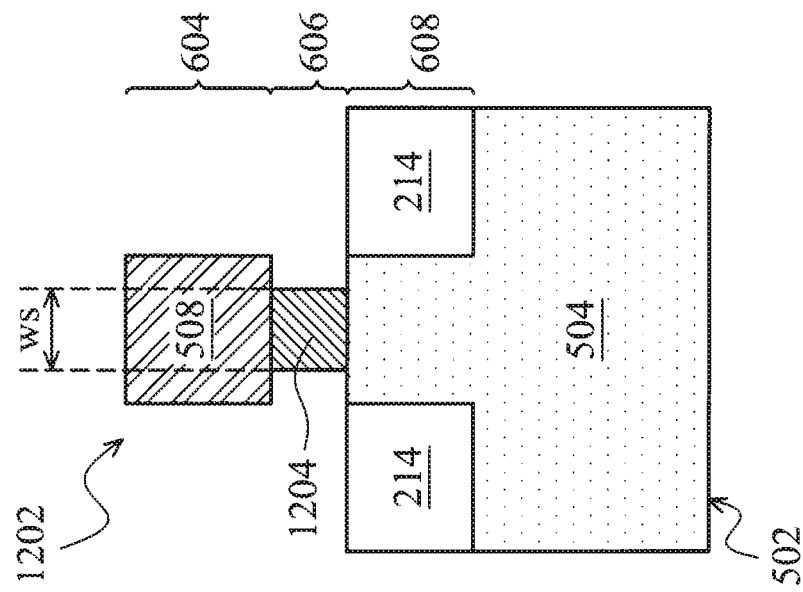
FIGS. 11-17 illustrate cross-sectional views of various embodiments of finFET devices fabricated according to one or more steps of the method of FIG. 4.

In another embodiment, the stem region is fully oxidized. FIG. 12 is illustrative of an embodiment of a fin 1202 having a stem region 606 that is substantially fully-oxidized. An oxidized region 1204 extends through the stem region 606. The stem region 606 may have a width ws, substantially similar to as discussed above. In an embodiment, the oxidized region 1204 is SiGeO. However, other compositions are possible including for example silicon dioxide, SiGeCO, SiCO, $GeO_2$, and/or other suitable oxides.

Figure 13:
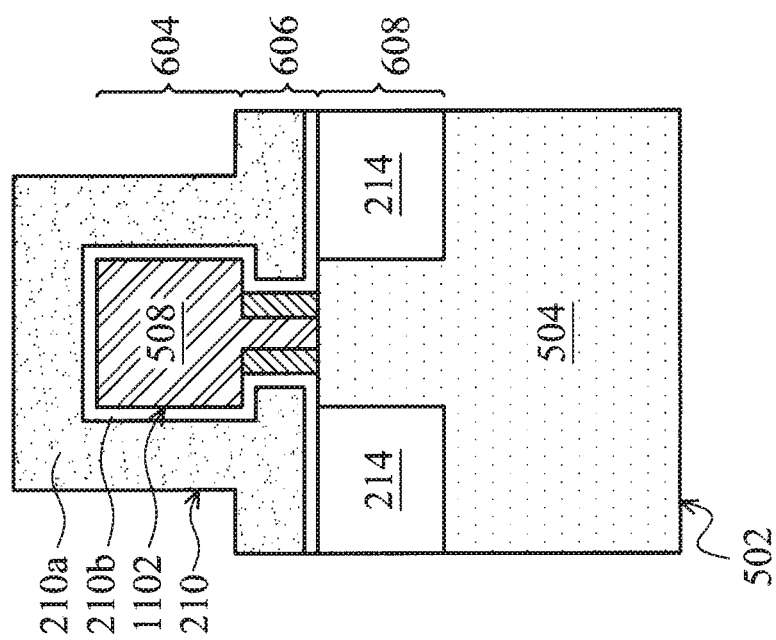

The method 1000 then proceeds to block 1012 where a gate structure is formed on the active region of the fin. Block 1012 may be substantially similar to block 410, described above with reference to FIG. 4. The active region of the fin overlies the stem region of the fin provided by block 1008 and 1010. Referring to the example of FIG. 13, a gate structure 210 is disposed on the active region of the fin 1102. The gate structure 210 includes the gate dielectric layer 210b and the gate electrode layer 210a. It is noted that FIG. 13 illustrates the gate structure formed on the fin 1102. In embodiments, a substantially similar gate structure is formed on the fin 1202 including the fully oxidized stem region 606.

In an embodiment, block 1012 includes forming a metal gate structure as part of gate-last or replacement gate methodology. In an embodiment, a dummy gate (e.g., polysilicon) is formed on the fin prior to the formation or processing of the stem region of the fin (e.g., the etching and/or oxidation of blocks 1008 and/or 1100). A portion of this dummy gate structure is then removed, while, for example, spacer and dielectric (e.g., ILD) remain on the substrate and define a trench within which a replacement gate can be formed. The removal of the dummy gate (e.g., polysilicon) exposes the fin structure. The exposed fin may then be etched and/or oxidized to form the stem region as described above with reference to blocks 1008 and/or 1100. This provides for a self-aligned processing, such as etching, of the stem region of the fin.

In an embodiment discussed above of the method 1000 and as illustrated in FIGS. 7, 8, 9, 11, and 12, a top surface of the isolation regions formed interposing the fins is substantially co-planar with a bottom surface of the stem region. However, other configurations are possible, including those discussed below.

Figure 14:
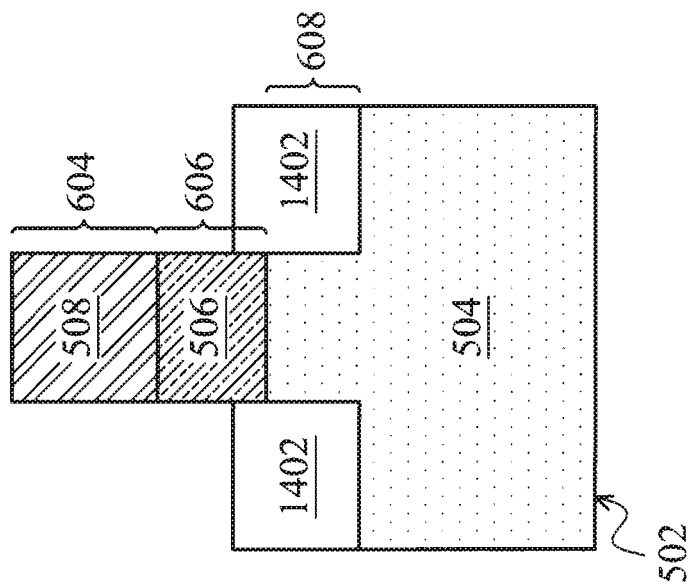

For example, in another embodiment of the method 1000 at block 1006 where an isolation region is formed, the isolation may be formed adjacent to the fin the isolation structure such that it has a top surface that lies above the plane of a bottom surface of the stem region of the fin. FIG. 14 is exemplary and illustrates isolation structures 1402 that have a top surface that lies above a bottom surface of the first epitaxial layer 506 and corresponding stem region 606. The isolation structures 1402 may be substantially similar to as discussed above with reference to FIGS. 1, 2, and/or 3. The isolation region may include a STI feature. In an embodiment, the isolation region includes a dielectric material such as silicon dioxide.

Figure 15:
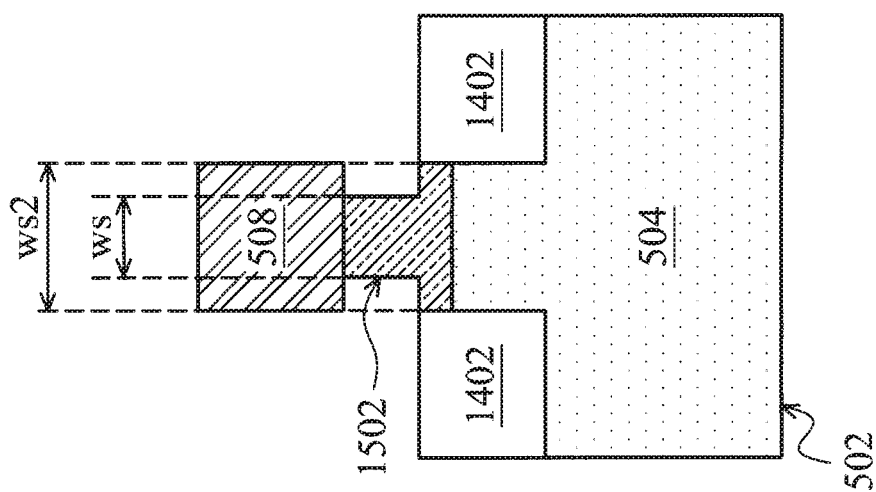

In such an embodiment, the method 1000 then proceeds to block 1008 where a stem region is formed in the fin. Block 1008 may be substantially similar to as described above and to block 408, described above with reference to FIG. 4. However, as the isolation region covers a portion of the sidewalls of the stem region of the fin, a portion of the stem region is not etched. FIG. 15 is illustrative of the first epitaxial layer 506 having been etched to form the stem region 1502. The stem region 1502 includes a first portion having a width Ws and a second portion having a width Ws2 that may be substantially similar to the Wp. In an embodiment, the stem region 1502 may be substantially centered under the second layer 508.

In an embodiment, the method 1000 then proceeds to block 1010 where the stem region (having a first portion exposed and having been etched and a second portion lying below a top surface of the isolation structure) is oxidized. Substantially similar to as discussed above with reference to block 1010, in an embodiment, the stem region includes silicon germanium that oxidizes to form SiGeO. However, other compositions are possible including for example silicon dioxide, SiGeCO, SiCO, $GeO_2$, and/or other suitable oxides.

Figure 16:
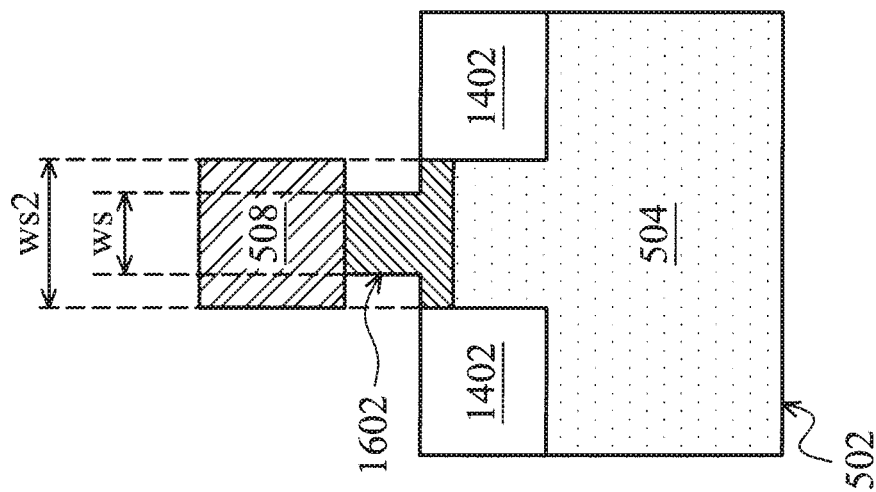

In an embodiment, the stem region is fully oxidized. FIG. 16 is illustrative of an embodiment of a fin having a fully-oxidized stem region 1602. The oxidized region extends throughout the width of the stem region. In an embodiment, the oxidized region 1602 may be substantially centered under the second layer 508.

Figure 17:
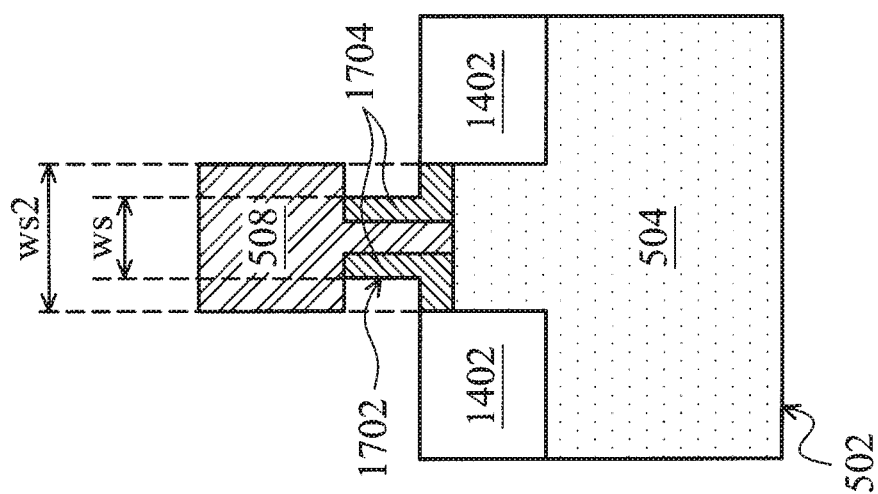

In an embodiment, the stem region is partially oxidized. FIG. 17 is illustrative of an embodiment of a fin having a partially oxidized stem region 1702. The partially-oxidized stem region 1702 includes an oxidized material 1704 does not extend through the stem region (e.g., a portion of the semiconductor material 506 remains). In an embodiment, the oxidized material 1704 is SiGeO and the semiconductor material 506 of the stem region 1702 is silicon germanium. However, other compositions are possible including for example silicon and silicon oxide, silicon germanium carbide and SiGeCO, silicon carbide and SiCO, germanium and GeO, and/or other suitable semiconductors and their oxides. It is noted that the partially oxidized stem region 1702 may be substantially centered under the second layer 508.

The method 1000 then proceeds to block 1012 where a gate structure is formed on the active region of the fin. Block 1012 may be substantially similar to as described above. It is noted that FIG. 13 illustrates the gate structure formed on the fin 1102. In embodiments, a substantially similar gate structure is formed on a fin having a stem region such as element 1602 and/or 1702.

Exemplary embodiments such as illustrated in FIGS. 16 and/or 17 may provide benefits such as a reduction of capacitance between the gate structure and the substrate.

FIGS. 11-17 are illustrative of embodiments of FinFet devices or portions thereof that may be formed using the method 1000, described above with reference to FIG. 10. However, these embodiments are not exhaustive and numerous other configurations of finFET devices may be formed. For example, various configurations of the stem region including the portions of the stem region and fin generally that are oxidized, the quantity of oxidization, and the like may be formed. FIGS. 18-25 are exemplary, but again, not intended to be limiting. The devices of FIGS. 18-25 may be formed using one or more of the steps of the method 1000. FIGS. 18*a*, 19*a*, 20*a*, 21*a*, 22*a*, 23*a*, 24*a*, and 25*a* are provided as a cross-sectional view (dimension a-a as illustrated in FIG. 2.). FIGS. 18*b*, 19*b*, 20*b*, 21*b*, 22*b*, 23*b*, 24*b*, and 25*b* are provided as a cross-sectional view (dimension b-b as illustrated in FIG. 2.); in other words, a cross-sectional view down the length of the fin from source to drain.

Referring now to FIGS. 18*a* and 18*b*, finFET device 1800 is illustrated. The FinFet device 1800 includes a substrate 502 having a fin with a passive region 608 and an active region 604. A stem region 1802 of the fin interposes the passive region 608 and the active region 604. Isolation features 1402 are disposed adjacent to the fin. The isolation features 1402 include a top surface that lies below the top surface of the stem region 1802. A gate structure 210 is disposed on the active region 604 of the fin. The gate structure 210 includes an interface layer 210*c*, a gate dielectric layer 210*a*, and a gate electrode layer 210*b*. In an embodiment, the gate electrode layer 210*b* is a metal gate electrode. In an embodiment, the gate dielectric layer 210*a* is a high-k dielectric(s). The interface layer 210*c* may include a dielectric such as silicon oxide and/or other suitable material. Spacer elements 1808 are disposed on the sidewalls of the gate structure 210. In an embodiment, the spacers 1808 are dielectric such as, for example, silicon nitride, silicon dioxide, silicon oxynitride, and/or combinations thereof. The spacers 1808 may be formed by conventional processes known in the art such as deposition including epitaxy and heteroepitaxy, and etching, including wet etch processes and/or dry etch processes. The spacer material may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer deposition (ALD), and/or other processes known in the art.

A dielectric layer, also referred to as an inter-layer dielectric (ILD), 1810 is disposed on the substrate. The ILD 1810 may include dielectric materials such as, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other materials known in the art. The ILD layer may be deposited by a PECVD process or other deposition techniques known in the art.

A source/drain region 212 is disposed adjacent the gate structure. The source/drain region 212 may be substantially similar to as discussed above with reference to FIGS. 1, 2, and/or 3.

The stem region 1802 of the fin includes an oxidized portion 1804 and a semiconductor material portion 1806. In an embodiment, the oxidized portion 1804 is formed substantially similar to block 1010 of the method 1000. (It is noted that the stem region 1802 has a width that is substantially similar to that of the passive region 608 and/or the active region 604). The oxidized portion 1804 has a thickness t1 between approximately 5 nm and approximately 30 nm. The oxidized portion 1804 extends such that it underlies the source/drain region 212. The semiconductor material portion 1806 may be a portion of the fin structure not oxidized (e.g., the portion 1804 may be an oxide of the composition of the portion 1806). In an embodiment, the oxidized portion 1804 is SiGeOx and the semiconductor material portion 1806 is SiGe. However, other combinations of a semiconductor and its oxide are possible.

Figure 19B:
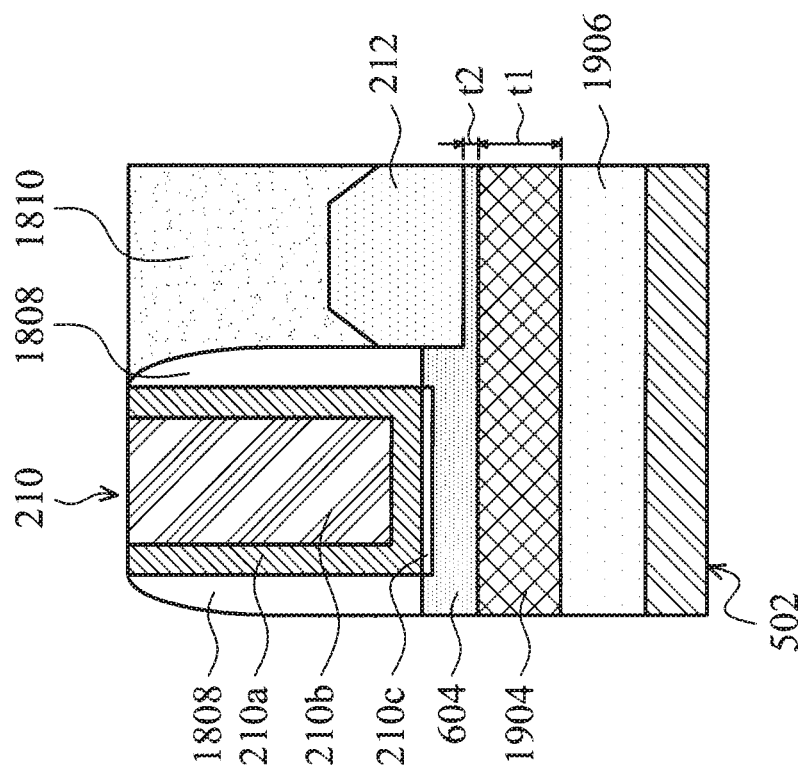
Figure 19A:
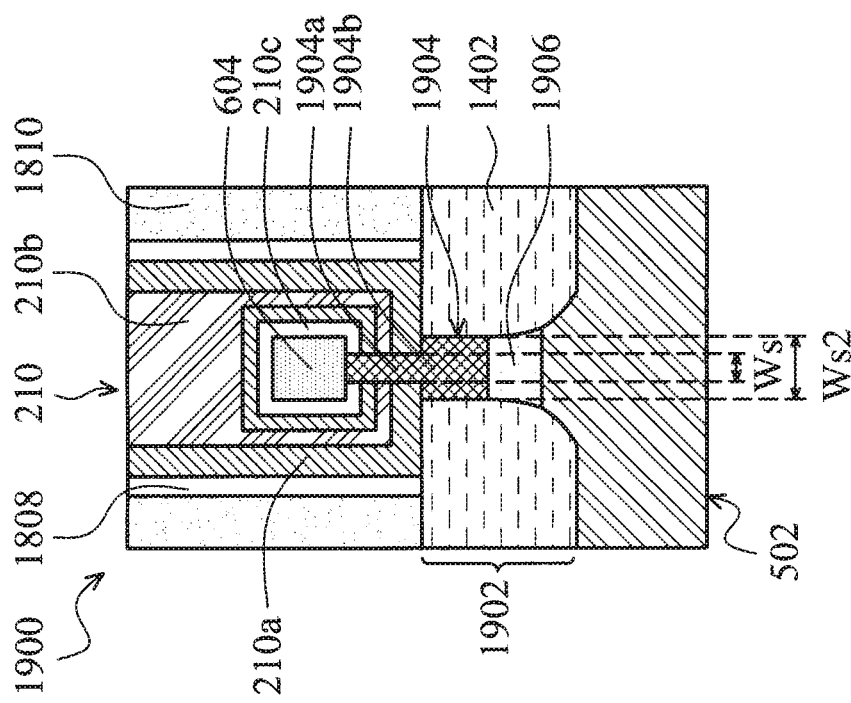

Referring now to FIGS. 19a and 19b, illustrated is another embodiment that may be formed using one or more of the methods described herein; a finFET device 1900 is illustrated. The finFET device 1900 includes a substrate 502 and a passive region 608 and an active region 604 of a fin. A stem region 1902 interposes the passive region 608 and the active region 604. Isolation features 1402, gate structure 210, spacer elements 1808, ILD 1810, and source/drain regions 212 may be substantially similar to as discussed above with reference to FIGS. 18a, 18b.

The stem region 1902 includes an oxidized portion 1904 and a semiconductor material portion 1906. In an embodiment, the oxidized portion 1904 is formed substantially similar to block 1010 of the method 1000. The oxidized portion 1904 includes a first portion 1904a having a width Ws and a second portion 1904b having a greater width Ws2. Ws may be substantially similar to as discussed above. Ws2 may be substantially similar to Wa and/or Wp, also discussed above with reference to FIGS. 2 and 3. The oxidized portion 1904 may have a thickness t1 between approximately 5 nm and approximately 30 nm. The oxidized portion 1904 extends such that it underlies the source/drain region 212. The semiconductor material portion 1906 may be a portion of the fin structure not oxidized (e.g., the portion 1904 may be an oxide of the composition of the portion 1906). In an embodiment, the oxidized portion 1904 is SiGeO and the semiconductor material portion 1906 is SiGe. It is also noted that a layer of semiconductor material underlies the source/drain region 212 (e.g., that of active region 604). In an embodiment, the thickness t2 of the semiconductor material underlying the source/drain region is between approximately 5 and 10 nm. In an embodiment, the semiconductor material underlying the source/drain region is silicon.

Figure 20B:
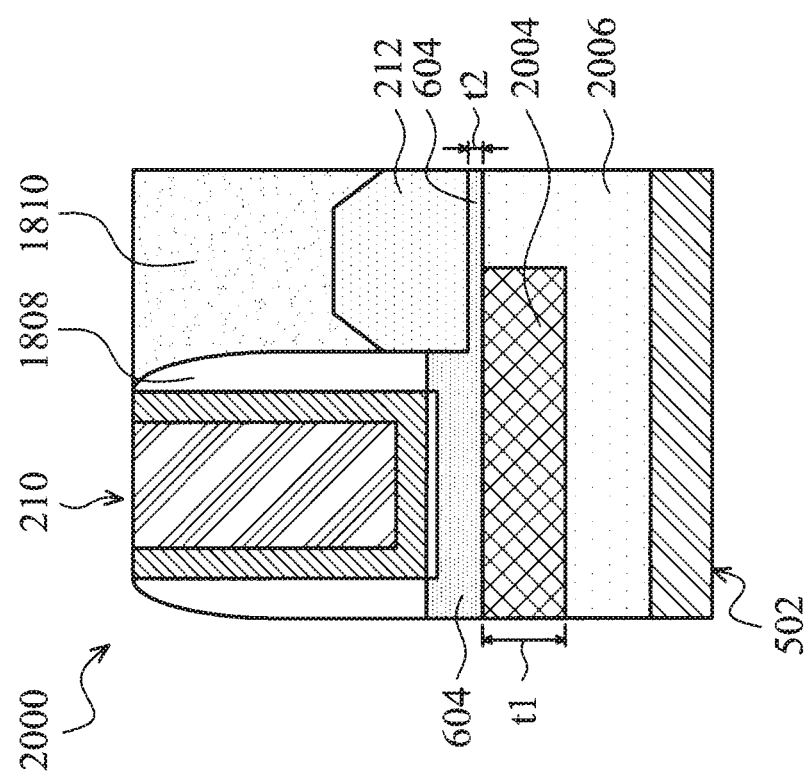
Figure 20A:
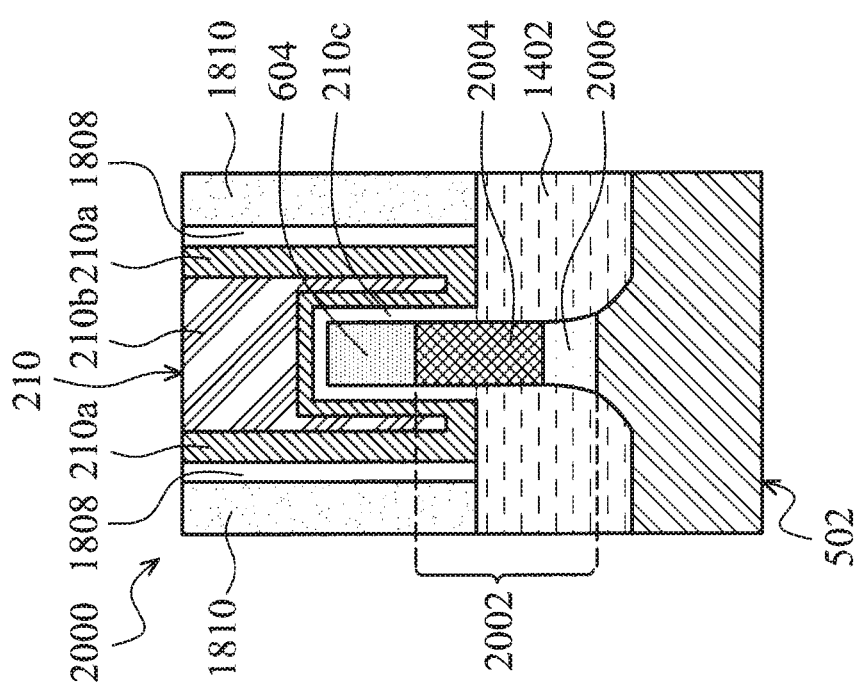

Referring now to FIGS. 20a and 20b, illustrated is another embodiment that may be formed using one or more of the methods described herein; a finFET device 2000 is illustrated. The FinFET device 2000 includes a substrate 502 having a passive region 608 and an active region 604 of a fin. A stem region 2002 interposes the passive region 608 and the active region 604. Isolation features 1402, gate structure 210, spacer elements 1808, ILD 1810, and source/drain regions 212 may be substantially similar to as discussed above with reference to FIGS. 18a, 18b.

The stem region 2002 includes an oxidized portion 2004 and a semiconductor material portion 2006. In an embodiment, the oxidized portion 2004 is formed substantially similar to block 1010 of the method 1000. The oxidized portion 2004 has a width that is substantially similar to that of the passive region 608 and/or the active region 604 of the fin. The semiconductor material portion 2006 may be a portion of the fin structure not oxidized (e.g., the portion 2004 may be an oxide of the composition of the portion 2006). In an embodiment, the oxidized portion 2004 is SiGeO and the semiconductor material portion 2006 is SiGe. The oxidized portion 2004 has a thickness t1 between approximately 5 nm and approximately 30 nm. The oxidized portion 2004 extends such that it does not underlie the entire source/drain region 212. In an embodiment, the oxidized portion 1904 underlies only a portion of the source/drain region 212. This can provide an oxide (e.g., SiGeO) under a channel region. It is also noted that a layer of semiconductor material underlies the source/drain region 212 (e.g., that of active region 604). In an embodiment, the thickness t2 of the semiconductor material underlying the source/drain region is between approximately 5 and 10 nm. In an embodiment, the semiconductor material underlying the source/drain region is silicon.

Figure 21B:
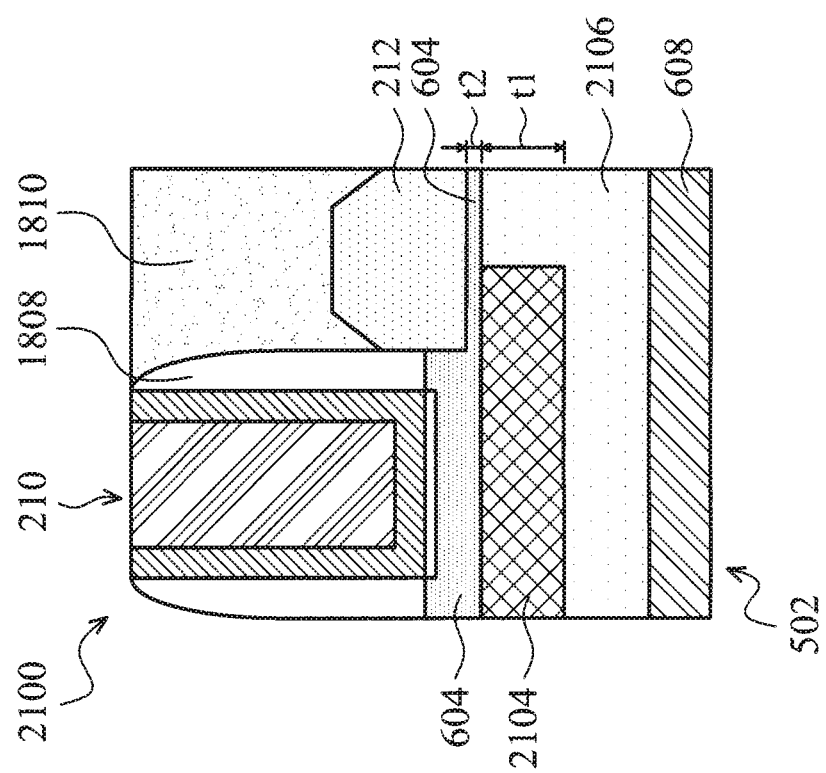
Figure 21A:
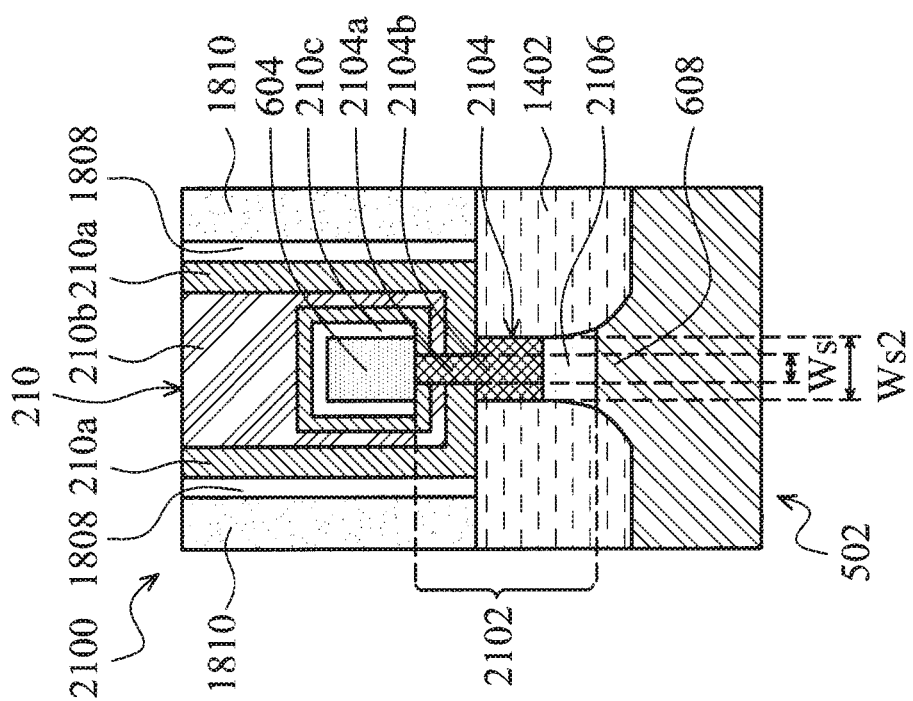

Referring now to FIGS. 21a and 21b, illustrated is another embodiment that may be formed using one or more of the methods described herein; a finFET device 2100 is illustrated. The finFET device 2100 includes a substrate 502 having a fin with a passive region 608 and an active region 604. A stem region 2102 interposes the passive region 608 and the active region 604. Isolation features 1402, gate structure 210, spacer elements 1808, ILD 1810, and source/drain regions 212 may be substantially similar to as discussed above with reference to FIGS. 18a, 18b.

The stem region 2102 includes an oxidized portion 2104 and a semiconductor material portion 2106. In an embodiment, the oxidized portion 2104 is formed substantially similar to block 1010 of the method 1000. The oxidized portion 2104 includes a first portion 2104a having a width Ws and a second portion 2104b having a greater width Ws2. Ws may be substantially similar to as discussed above. Ws2 may be substantially similar to Wa and/or Wp, also discussed above with reference to FIGS. 2 and 3 The difference in width of the stem region 2102 may be provided by methods including those described in method 1, 4, and 10 above. The oxidized portion 2104 has a thickness t1 between approximately 5 nm and approximately 30 nm. The semiconductor material portion 2106 may be a portion of the fin structure not oxidized (e.g., the portion 2104 may be an oxide of the composition of the portion 2106). In an embodiment, the oxidized portion 2104 is SiGeO and the semiconductor material portion 2106 is SiGe. The oxidized portion 2104 extends such that it does not underlie the entire source/drain region 212. In an embodiment, the oxidized portion 2104 underlies only a portion of the source/drain region 212. This can provide an oxide (e.g., SiGeO) under a channel region. It is also noted that a layer of semiconductor material underlies the source/drain region 212 (e.g., that of active region 604). In an embodiment, the thickness t2 of the semiconductor material underlying the source/drain region is between approximately 5 and 10 nm. In an embodiment, the semiconductor material underlying the source/drain region is silicon.

Figure 22B:
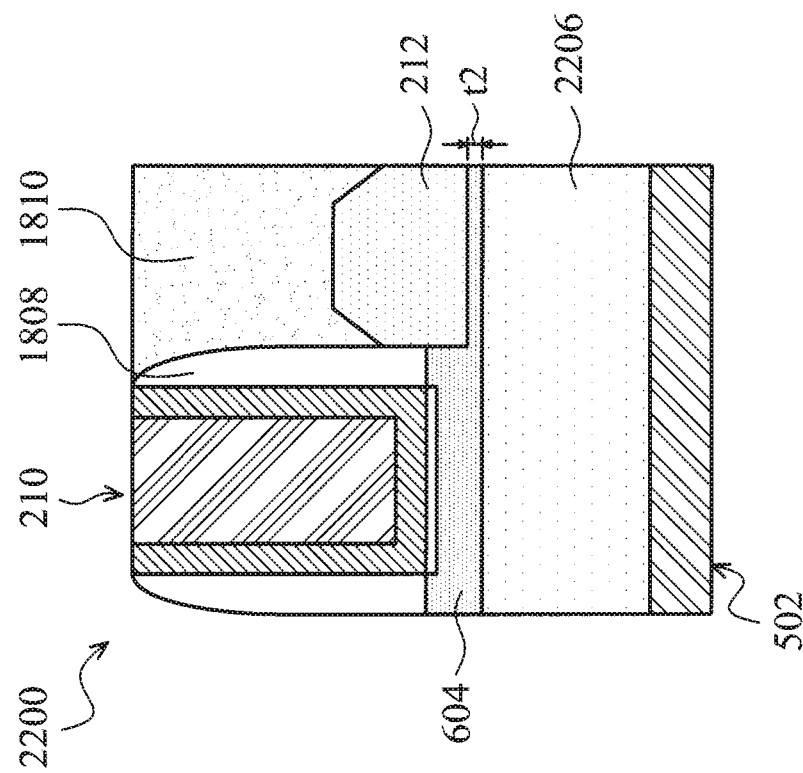
Figure 22A:
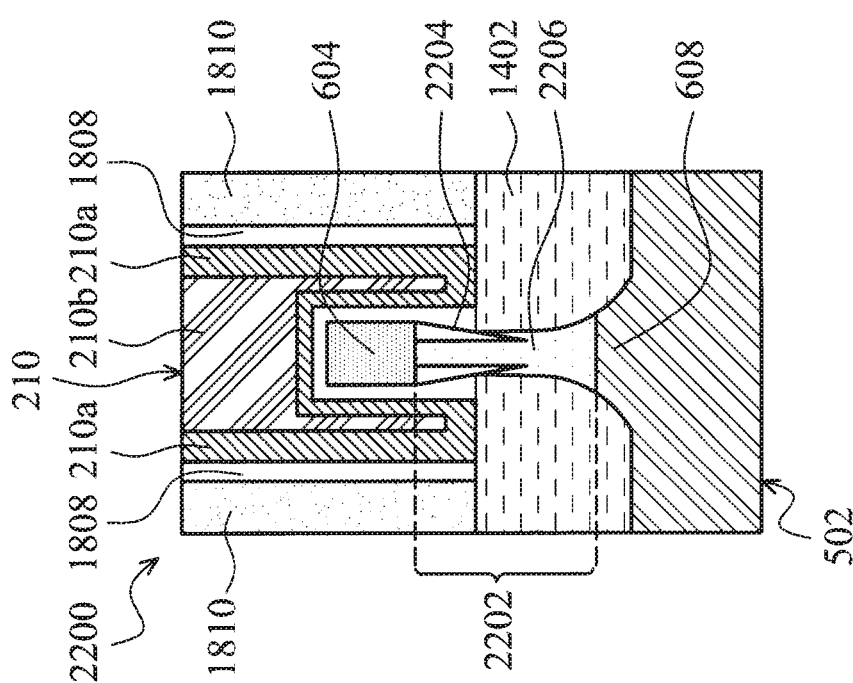

Referring now to FIGS. 22a and 22b, illustrated is another embodiment that may be formed using one or more of the methods described herein; a FinFET device 2200 is illustrated. The finFET device 2200 includes a substrate 502 having a passive region 608 and an active region 604 of a fin. A stem region 2202 interposes the passive region 608 and the active region 604. Isolation features 1402, gate structure 210, spacer elements 1808, ILD 1810, and source/drain regions 212 may be substantially similar to as discussed above with reference to FIGS. 18a, 18b.

The stem region 2202 includes an oxidized portion 2204 and a semiconductor material portion 2206. In an embodiment, the oxidized portion 2204 is formed substantially similar to block 1010 of the method 1000. The width of the stem region 2202 of the fin may be substantially similar to that the active region and/or the passive region of the stem. In an embodiment, the oxidized portion 2204 is SiGeO and the semiconductor material portion 2206 is SiGe. It is also noted that a layer of semiconductor material underlies the source/drain region 212 (e.g., that of active region 604). In an embodiment, the thickness t2 of the semiconductor material underlying the source/drain region is between approximately 5 and 10 nm. In an embodiment, the semiconductor material underlying the source/drain region is silicon.

Referring now to FIGS. 23a and 23b, illustrated is another embodiment that may be formed using one or more of the methods described herein; a finFET device 2300 is illustrated. The finFET device 2300 includes a substrate 502 having a passive region 608 and an active region 604 of a fin. A stem region 2302 interposes the passive region 608 and the active region 604. Isolation features 1402, gate structure 210, spacer elements 1808, ILD 1810, and source/drain regions 212 may be substantially similar to as discussed above with reference to FIGS. 18a, 18b.

The stem region 2302 includes an oxidized portion 2304 and a semiconductor material portion 2306. In an embodiment, the oxidized portion 2304 is formed substantially similar to block 1010 of the method 1000.

The stem region 2302 includes a first portion 2302a having a width ws and a second portion 2302b having a greater width ws3. Ws3 may be substantially similar to wa and/or wp, discussed above with reference to FIGS. 2 and 3 The widths may be provided using a stem etch process such as described above with reference to FIGS. 1, 4, and/or 10. The semiconductor material portion 2306 may be a portion of the fin structure not oxidized (e.g., the portion 2304 may be an oxide of the composition of the portion 2306). In an embodiment, the oxidized portion 2304 is SiGeOx and the semiconductor material portion 2306 is SiGe. It is also noted that a layer of semiconductor material underlies a portion of the source/drain region 212 (e.g., that of active region 604). In an embodiment, the thickness t2 of the semiconductor material underlying the source/drain region is between approximately 5 and 10 nm. In an embodiment, the semiconductor material underlying the source/drain region is silicon.

Figure 24B:
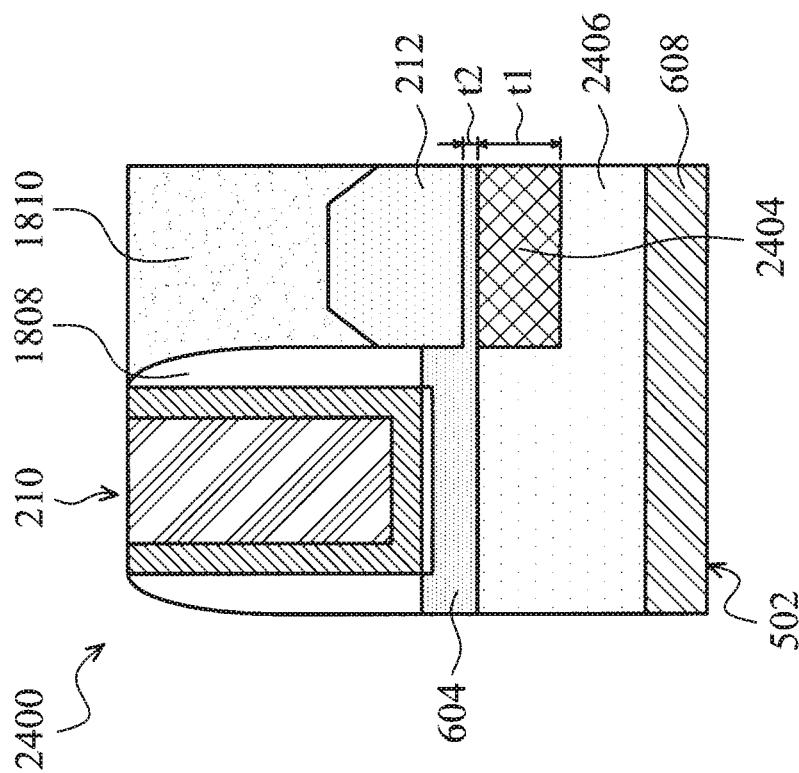
FIGS. 24a, 24b, 25a, and 25b illustrate cross-sectional views of embodiments of p-channel finFET devices fabricated according to one or more steps of the present disclosure.
Figure 24A:
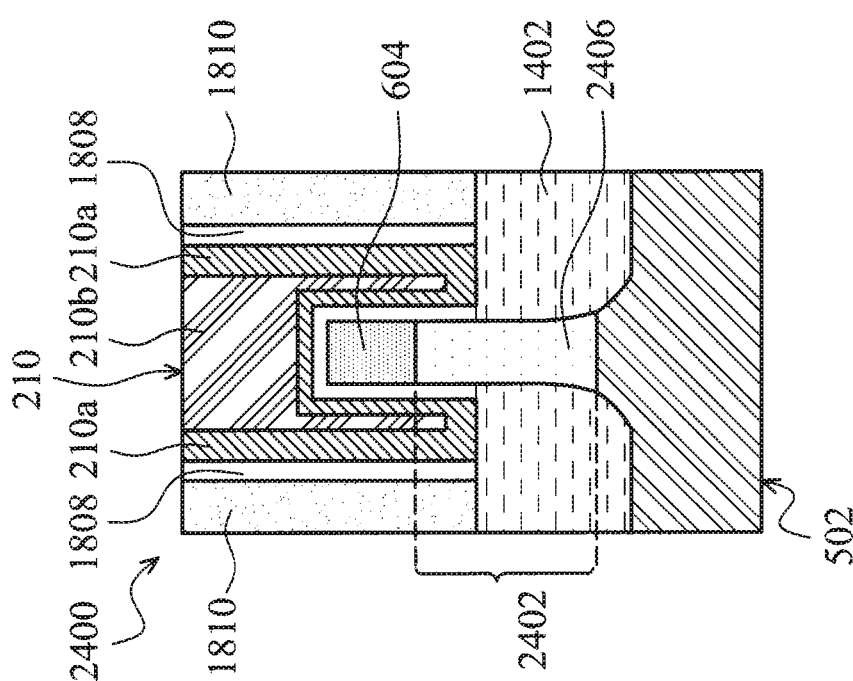

Referring now to FIGS. 24a and 24b, illustrated is another embodiment that may be formed using one or more of the methods described herein; a FinFET device 2400 is illustrated. The FinFET device 2400 may be a p-channel device. The FinFET device 2400 includes a substrate 502 having a passive region 608 and an active region 604 of a fin. A stem region 2402 interposes the passive region 608 and the active region 604. Isolation features 1402, gate structure 210, spacer elements 1808, ILD 1810, and source/drain regions 212 may be substantially similar to as discussed above with reference to FIGS. 18a, 18b.

The stem region 2402 includes an oxidized portion 2404 and a semiconductor material portion 2406. In an embodiment, the oxidized portion 2404 is formed substantially similar to block 1010 of the method 1000. The oxidized portion 2404 includes a width that may be substantially similar to the width of the active region and/or passive region of the fin. The oxidized portion 2404 has a thickness t1 between approximately 5 nm and approximately 30 nm. The oxidized portion 2404 extends such that it underlies the source/drain region 212. The semiconductor material portion 2406 may be a portion of the fin structure not oxidized (e.g., the portion 2404 may be an oxide of the composition of the portion 2406). In an embodiment, the oxidized portion 2404 is SiGeO and the semiconductor material portion 2406 is SiGe. It is also noted that a layer of semiconductor material underlies the source/drain region 212 (e.g., that of active region 604). In an embodiment, the thickness t2 of the semiconductor material underlying the source/drain region is between approximately 5 and 10 nm. In an embodiment, the semiconductor material underlying the source/drain region is silicon.

Figure 25A:
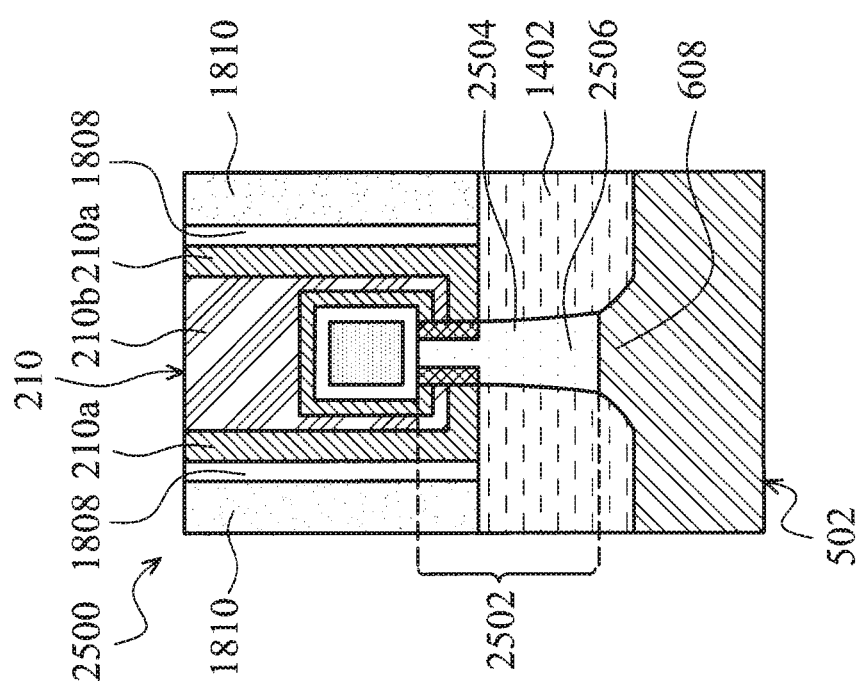
Figure 25B:
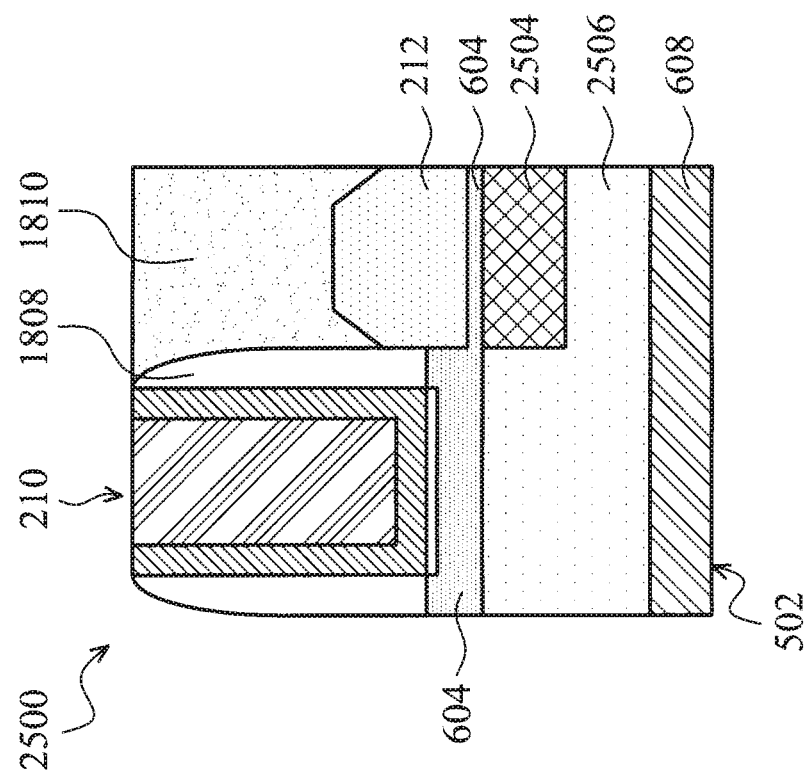

Referring now to FIGS. 25a and 25b, illustrated is another embodiment that may be formed using one or more of the methods described herein; a finFET device 2500 is illustrated. The finFET device 2500 may be a p-channel device. The finFET device 2500 includes a substrate 502 having a passive region 608 and an active region 604 of a fin. A stem region 2502 interposes the passive region 608 and the active region 604. Isolation features 1402, gate structure 210, spacer elements 1808, ILD 1810, and source/drain regions 212 may be substantially similar to as discussed above with reference to FIGS. 18a, 18b.

The stem region 2502 includes an oxidized portion 2504 and a semiconductor material portion 2506. In an embodiment, the oxidized portion 2504 is formed substantially similar to block 1010 of the method 1000. The stem region 2502 may include a width that may be substantially similar to the width of the active region and/or passive region of the fin. The stem region 2502 may also include a region having a narrower width substantially similar to as discussed above, for example, with reference to FIG. 23. The oxidized portion 2504 extends such that it underlies the source/drain region 212. The semiconductor material portion 2506 may be a portion of the fin structure not oxidized (e.g., the portion 2504 may be an oxide of the composition of the portion 2506). In an embodiment, the oxidized portion 2504 is SiGeO and the semiconductor material portion 2506 is SiGe. In the illustrated embodiment, more oxide (e.g., oxidized portion 2504) is provided under a portion of the source/drain region than under the channel region of the device. It is also noted that a layer of semiconductor material underlies the source/drain region 212 (e.g., that of active region 604). In an embodiment, the thickness t2 of the semiconductor material underlying the source/drain region is between approximately 5 and 10 nm. In an embodiment, the semiconductor material underlying the source/drain region is silicon.

In summary, the methods and devices disclosed herein provide for various embodiments of a stem region of a fin element used in a finFET transistor. It is understood that different embodiments disclosed herein offer different disclosure, and that they may make various changes, substitutions and alterations herein without departing from the spirit and scope of the present disclosure.

Thus, it is understood that in one of the broader embodiments discussed herein, provided is a method of fabricating a semiconductor device. The method includes providing a substrate having a fin extending from a first (e.g., top) surface of the substrate. The fin has first region having a first composition of semiconductor material and a second region having a second composition of semiconductor material. The second composition is different than the first composition. For example, in an embodiment the first composition is SiGe, the second composition is Si. The method then proceeds to modifying the first region of the fin to decrease a width of the first composition of semiconductor material. Exemplary manners of modifying the first region include etching the first region to decrease its width, oxidizing the first region or portion thereof to decrease the width of the conductive material portion of the first region, and/or other methods. In a further embodiment, the method includes both etching the first region and oxidizing the first region. The method then continues to provide a gate structure on the second region of the fin.

In a further embodiment, the method continues to forming a dummy gate structure on the fin and removing the dummy gate structure to provide a trench. The etching the first region can then be performed by etching the first region in the trench. This allows for a self-aligned formation of a stem region or decreased width of a portion of the fin.

In a further embodiment, forming the gate structure includes forming an interface between the gate structure and a top surface, a first side surface, second side surface, and a bottom surface of the second region. Such a gate structure may be referred to as an omega-gate or quasi-surround gate structure. In an embodiment, the forming the gate structure includes depositing a gate dielectric on a sidewall of the first region of the fin. A channel region associated with the gate structure may be formed in the fin. In one embodiment, the channel region is only in the second region of the fin.

In another of the broader embodiments, a method is described that includes providing a bulk semiconductor substrate. The bulk semiconductor substrate may include a substrate that is not an SOI substrate. A first epitaxial layer (e.g., SiGe) is grown on the bulk semiconductor substrate; a second epitaxial layer (e.g., Si) is grown on the first epitaxial layer. Thereafter, a fin element is formed including the first and second epitaxial layers. The first epitaxial layer of the fin is then etched to form a stem region having a width less than a width of the second epitaxial layer of the fin. A channel of a transistor is then formed in the second epitaxial layer of the fin.

In an embodiment, etching the first epitaxial layer is a selective etch such that the second epitaxial layer is substantially unetched. In an embodiment, the method further includes forming a gate structure on the second epitaxial layer of the fin where the gate structure interfaces at least four surfaces of the second epitaxial layer of the fin (e.g., including the bottom surface providing a quasi-surround or omega gate structure). The method may further include oxidizing the stem region after the etching of the first epitaxial layer.

Numerous devices are also described herein, including, a finFET device having a substrate and a fin disposed on the substrate. The fin includes a passive region, a stem region overlying the passive region, and an active region overlying the stem region. The stem region has a first width and the active region has a second width. The first width is less than the second width. The stem region and the active region also have different compositions. A gate structure is disposed on the active region.

In an embodiment, the substrate is a bulk semiconductor substrate (e.g., not an SOI substrate). In an embodiment, the gate structure includes a metal gate electrode, for example, formed by a replacement gate methodology. In an embodiment, the gate structure interfaces with a top surface, a first side surface, a second side surface, and a bottom surface of the active region of the fin. Thus, in an embodiment, the gate structure may be a quasi-surround or omega gate structure.

What is claimed is:

1. A device comprising:
a fin disposed on a substrate, wherein the fin includes a passive region, a stem region overlying the passive region, and an active region overlying the stem region, wherein the stem region has a first portion formed of a first semiconductor material and a second portion formed of an oxide material, the second portion being disposed over the first portion, wherein the active region is formed of a second semiconductor material;
a gate structure disposed on the active region, the gate structure including a gate dielectric layer and a gate electrode, wherein the gate dielectric layer physically contacts a sidewall surface of the second portion of the stem region formed of the oxide material at a first interface and the gate electrode physically contacts the sidewall surface of the second portion of the stem region formed of the oxide material at a second interface that is higher above the substrate than the first interface; and
a source/drain feature adjacent the gate structure, wherein the active region, the first portion and the second portion of the stem region extend under a bottommost edge of the source/drain feature.

2. The device of claim 1, wherein the active region interfaces with the second portion of the stem region.

3. The device of claim 1, wherein the gate dielectric layer is further disposed on and physically contacting the active region of the stem region.

4. The device of claim 1, further comprising a shallow trench isolation structure disposed on the substrate, and
wherein the shallow trench isolation structure interfaces with the second portion of the stem region, the first portion of the stem region and the passive region.

5. The device of claim 1, wherein the active region extends to and physically contacts the bottommost edge of the source/drain feature.

6. The device of claim 1, wherein the oxide material has a same width from the active region to the first portion of the stem region.

7. The device of claim 1, wherein the oxide material extends under the bottommost edge of the source/drain feature,
wherein the oxide material disposed under the bottommost edge of the source/drain feature has a top surface facing the bottommost edge of the source/drain feature and an opposing bottom surface facing away from the bottommost edge of the source/drain feature and a sidewall surface connecting the top surface to the bottom surface, and
wherein the first semiconductor material interfaces with the sidewall of the oxide material under the bottommost edge of the source/drain feature.

8. A device comprising:
a fin disposed on a substrate, wherein the fin includes a passive region, a stem region overlying the passive region, and an active region overlying the stem region, wherein the stem region has a first width and the active region has a second width, the first width being different than the second width, and wherein the stem region includes a portion formed of an oxide material having the first width;
a gate structure disposed on the active region, the gate structure including a gate dielectric layer and a gate electrode, wherein the gate dielectric layer physically contacts a sidewall surface of the portion of the stem region formed of the oxide material at a first interface and the gate electrode physically contacts the sidewall surface of the portion of the stem region formed of the oxide material at a second interface that is higher above the substrate than the first interface.

9. The device of claim 8, further comprising a dielectric isolation structure disposed on the substrate, and
wherein the stem region extends through dielectric isolation structure and the gate electrode to the active region,
wherein the stem region has a third width while extending through the dielectric isolation structure and the first width extending through the gate electrode, the third width being different than the first width.

10. The device of claim 9, wherein the stem region having the third width is formed of the oxide material.

11. The device of claim 10, wherein the stem region further includes a first semiconductor material layer extending through the dielectric isolation structure and having the third width, the first semiconductor material layer interfacing with the oxide material having the third width, and wherein the active region is formed of a second semiconductor material layer having the second width, the second semiconductor material layer interfacing with the oxide material having the first width.

12. The device of claim 11, wherein the passive region extends from the first semiconductor material layer to under the dielectric isolation structure.

13. The device of claim 8, wherein oxide material having the first width includes a first sidewall and an opposing second sidewall, and wherein the gate dielectric layer interfaces with the first and second sidewalls of the oxide material having the first width.

14. A device comprising:

a fin disposed on a substrate, wherein the fin includes:
   a passive region;
   a stem region disposed over the passive region, wherein the stem region includes:
      a first semiconductor material layer disposed over and interfacing with the passive region; and
      an oxide portion disposed over and interfacing with the first semiconductor material layer; and
   an active region disposed over an interfacing with the oxide portion, the active region formed of a second semiconductor material layer;

a gate dielectric layer disposed on the active region and extending to the oxide portion such that the gate dielectric layer physically contacts a sidewall surface of the oxide portion at a first interface; and a gate electrode layer disposed on the gate dielectric layer and extending to the oxide portion such that the gate electrode layer physically contacts the sidewall surface of the oxide portion at a second interface that is higher above the substrate than the first interface.

15. The device of claim 14, further comprising a source/drain feature, and wherein the first semiconductor material layer interfaces with the oxide portion of the stem and the active region directly under the source/drain feature.

16. The device of claim 15, wherein the source/drain feature interfaces with the active region.

17. The device of claim 14, wherein the active region has a substantially constant width and the oxide portion has a non-uniform width.

18. The device of claim 14, further comprising a shallow trench isolation structure disposed on the substrate, and wherein the shallow trench isolation structure interfaces with the passive region and the stem region of the fin.

19. The device of claim 14, wherein the second semiconductor material layer includes Si.

20. The device of claim 14, wherein a portion of the gate electrode layer is disposed directly under the active region of the fin, the portion of the gate electrode layer disposed directly under the active region of the fin is separated from the active region of the fin by a portion of the gate dielectric layer.

* * * * *